United States Patent
Lee et al.

(10) Patent No.: US 12,419,176 B2
(45) Date of Patent: Sep. 16, 2025

(54) DISPLAY PANEL AND DEPOSITION APPARATUS

(71) Applicant: Samsung Display Co., Ltd., Yongin-si (KR)

(72) Inventors: Seungjin Lee, Suwon-si (KR); Sangshin Lee, Yongin-si (KR); Sanghoon Kim, Hwaseong-si (KR); Jongsung Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 542 days.

(21) Appl. No.: 17/736,473

(22) Filed: May 4, 2022

(65) Prior Publication Data
US 2023/0054040 A1    Feb. 23, 2023

(30) Foreign Application Priority Data
Aug. 17, 2021    (KR) .................. 10-2021-0108199

(51) Int. Cl.
| | |
|---|---|
| *H01L 27/32* | (2006.01) |
| *C23C 14/04* | (2006.01) |
| *H01L 51/56* | (2006.01) |
| *H10K 59/35* | (2023.01) |
| *H10K 71/00* | (2023.01) |
| *H10K 71/16* | (2023.01) |

(52) U.S. Cl.
CPC ......... *H10K 59/353* (2023.02); *C23C 14/042* (2013.01); *H10K 59/352* (2023.02); *H10K 71/00* (2023.02); *H10K 71/166* (2023.02)

(58) Field of Classification Search
CPC ............................................ H10K 59/35–353
See application file for complete search history.

(56) References Cited

U.S. PATENT DOCUMENTS

| | | | |
|---|---|---|---|
| 7,802,537 B2 | 9/2010 | Kang | |
| 9,728,588 B2 | 8/2017 | Peng et al. | |
| 12,048,217 B2* | 7/2024 | Hong | H10K 50/865 |
| 2005/0270444 A1* | 12/2005 | Miller | G09G 3/3216 |
| | | | 349/108 |
| 2006/0081844 A1* | 4/2006 | Hirosue | H10D 86/0241 |
| | | | 257/E27.111 |
| 2015/0357395 A1* | 12/2015 | Cheon | H10K 59/351 |
| | | | 257/89 |

FOREIGN PATENT DOCUMENTS

| | | |
|---|---|---|
| KR | 10-0659057 | 12/2006 |
| KR | 10-2079171 | 2/2020 |

* cited by examiner

*Primary Examiner* — Victoria K. Hall
(74) *Attorney, Agent, or Firm* — Lerner David LLP

(57) ABSTRACT

A display panel includes first display regions, and a second display region between the two first display regions. Each of the first display regions includes first pixels. The second display region includes second pixels disposed in a second direction intersecting a first direction. Each of the second pixels include a first color light-emitting element, a second color light-emitting element, and a third color light-emitting element which are disposed in the first direction. An arrangement of the first color light-emitting element, the second color light-emitting element, and the third color light-emitting element of each of the first pixels may be different from an arrangement of the first color light-emitting element, the second color light-emitting element, and the third color light-emitting element of each of the second pixels.

14 Claims, 20 Drawing Sheets

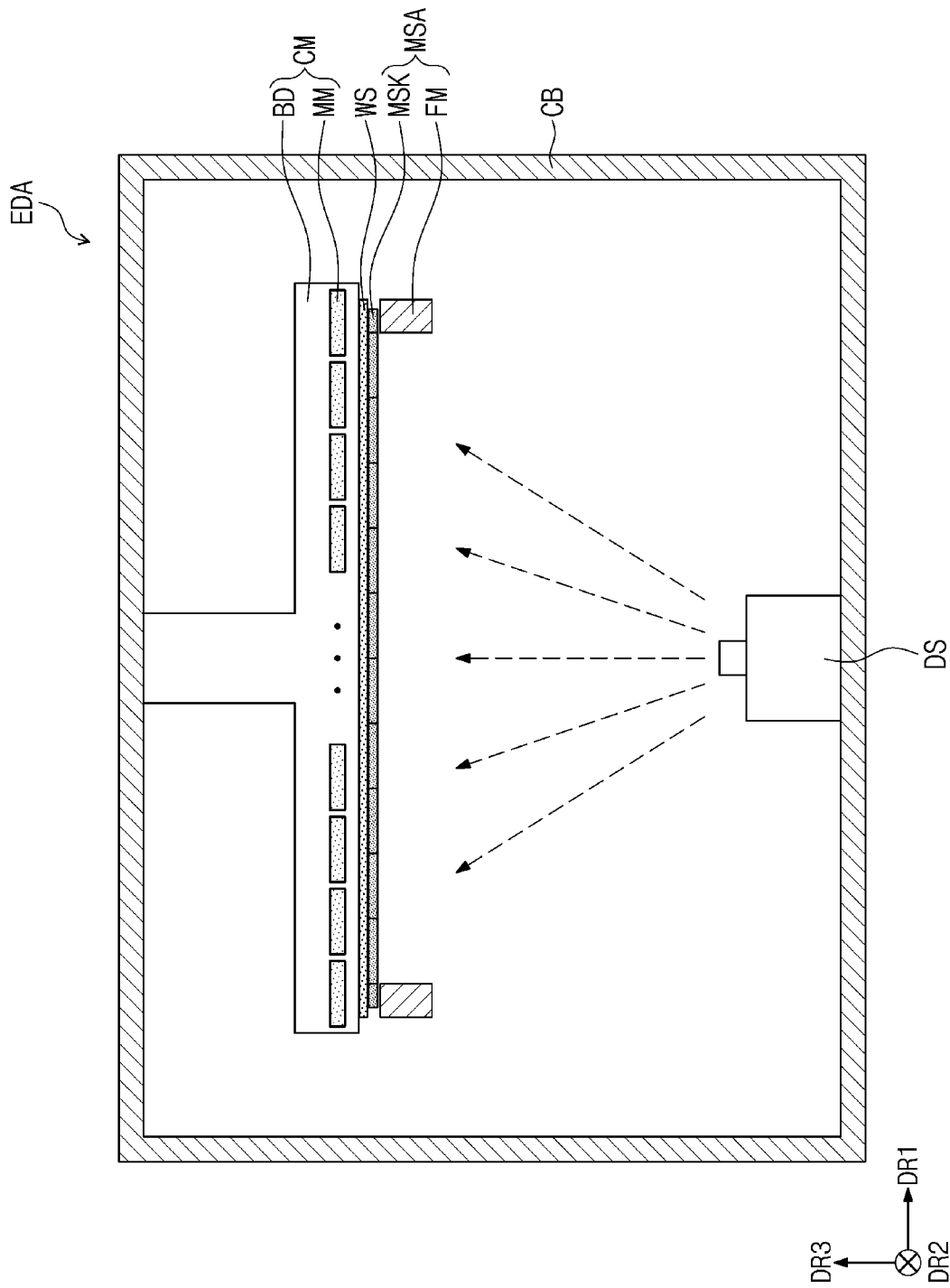

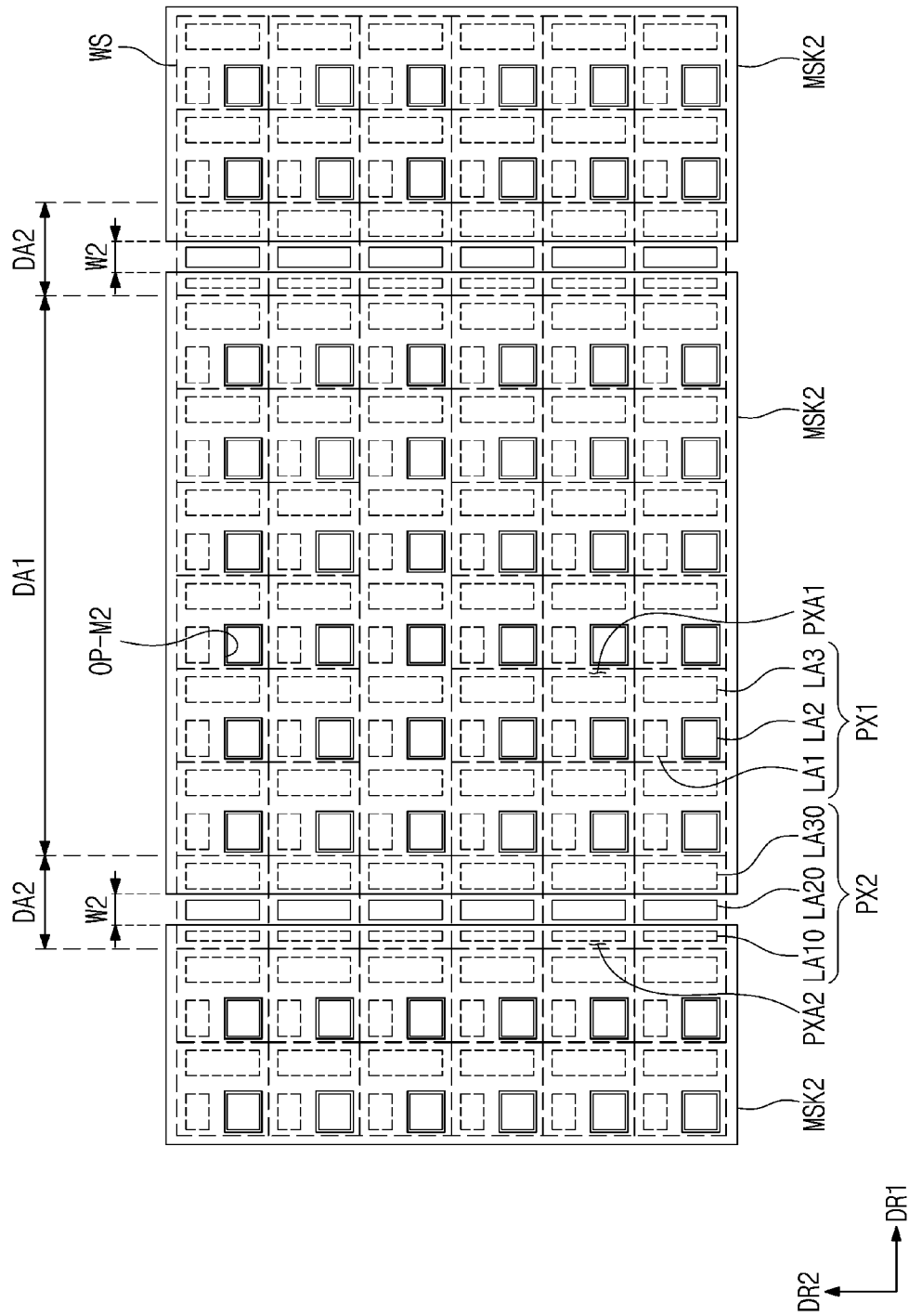

DISPLAY PANEL AND DEPOSITION APPARATUS

CROSS-REFERENCE TO RELATED APPLICATION(S)

This U.S. non-provisional patent application claims priority to and benefits of Korean Patent Application No. 10-2021-0108199 under 35 U.S.C. § 119, filed on Aug. 17, 2021 in the Korean Intellectual Property Office, the entire contents of which are incorporated herein by reference.

BACKGROUND

1. Technical Field

The disclosure herein relates to a display panel including two kinds of pixels, and a deposition apparatus including three kinds of mask assemblies.

2. Description of the Related Art

Generally, in a light-emitting display panel, a light-emitting element may be disposed for each pixel. A light-emitting element may include a light-emitting layer disposed between two electrodes. Light-emitting layers disposed in pixels may be classified into multiple groups.

Multiple mask assemblies may be used to deposit multiple groups of light-emitting layers onto a work substrate. Each of the mask assemblies may include a frame, and a mask. After a work substrate may be disposed on a mask, a light-emitting material may be deposited onto the work substrate and patterned, thereby forming light-emitting layers.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display panel with improved aperture ratio and reduced defect ratio.

The disclosure also provides a deposition apparatus capable of manufacturing the display panel.

An embodiment of the disclosure provides a device panel that may include two first display regions spaced apart in a first direction, and a second display region between the two first display regions. Each of the two first display regions may include first pixels. The second display region may include second pixels disposed in a second direction intersecting the first direction. The first pixels, and the second pixels each may include a first color light-emitting element, a second color light-emitting element, and a third color light-emitting element. The first color light-emitting element, the second color light-emitting element, and the third color light-emitting element of each of the second pixels may be disposed in the first direction. An arrangement of the first color light-emitting element, the second color light-emitting element, and the third color light-emitting element of each of the first pixels may be different from an arrangement of the first color light-emitting element, the second color light-emitting element, and the third color light-emitting element of each of the second pixels.

In an embodiment, a minimum distance between two adjacent light-emitting elements among the first color light-emitting element, the second color light-emitting element, and the third color light-emitting element of each of the first pixels may be greater than a minimum distance between two adjacent light-emitting elements among the first color light-emitting element, the second color light-emitting element, and the third color light-emitting element of each of the second pixels.

In an embodiment, the second color light-emitting element of each of the first pixels may be spaced apart from the first color light-emitting element in the second direction, and the third color light-emitting element of each of the first pixels may be spaced apart from the first color light-emitting element in the first direction.

In an embodiment, a center in the second direction of the first color light-emitting element of each of the second pixels may be spaced apart from a center in the second direction of the second color light-emitting element of each of the second pixels.

In an embodiment, a center in the second direction of the first color light-emitting element of each of the first pixels may be aligned, in the first direction, with the center in the second direction of the first color light-emitting element of each of the second pixels.

In an embodiment, light-emitting regions of the first color light-emitting element, the second color light-emitting element, and the third color light-emitting element may have different areas relative to each other.

In an embodiment, light-emitting regions of the first color light-emitting element of each of the first pixels and the first color light-emitting element of each of the second pixels may have different shapes.

In an embodiment, the light-emitting regions of the first color light-emitting element of each of the first pixels and the first color light-emitting element of each of the second pixels may have substantially a same area.

In an embodiment, the first pixels may define n×m pixel rows and pixel columns, where n and m may be each a natural number equal to or greater than 2. A light-emitting layer of the third color light-emitting element of the first pixel disposed on an i-th pixel row, where i may be a natural number equal to or greater than 1, and less than n, and a j-th pixel column, where j may be a natural number equal to or greater than 1, and less than m, and a light-emitting layer of the third color light-emitting element of the first pixel disposed on an (i+1)-th pixel row and the j-th pixel column may be integral with each other.

In an embodiment, a center in the second direction of the third color light-emitting element of the first pixel disposed on the i-th pixel row and the j-th pixel column, and a center in the second direction of the third color light-emitting element of a first pixel disposed on the i-th pixel row and the (j+1)-th pixel column may be spaced apart from each other in the second direction.

In an embodiment, a light-emitting layer of the third color light-emitting element of the first pixel disposed on an (i−1)-th pixel row and the j-th pixel column, and the light-emitting layer of the third color light-emitting element of the first pixel disposed on the i-th pixel row and the j-th pixel column may be spaced apart from each other in the second direction. A distance between the third color light-emitting element of the first pixel disposed on the i-th pixel row and the j-th pixel column, and the third color light-emitting element of the first pixel disposed on the (i+1)-th pixel row and the j-th pixel column may be less than a distance between the third color light-emitting element of the first pixel disposed on the (i−1)-th pixel row and the j-th pixel column, and the third color light-emitting element of the first pixel disposed on the i-th pixel row and the j-th pixel column.

In an embodiment, the first pixels may define n×m pixel rows and pixel columns, where n and m may be each a natural number equal to or greater than 2, and less than n. A light-emitting layer of the third color light-emitting element of a first pixel disposed on an i-th pixel row, where i may be a natural number equal to or greater than 1, and less than n, and a j-th pixel column, where j may be a natural number equal to or greater than one, and less than m, to a light-emitting layer of the third color light-emitting element of a first pixel disposed on an (i+3)-th pixel row and the j-th pixel column may be integral with each other.

In an embodiment, among the second pixels, a light-emitting layer of the first color light-emitting element of a second pixel, and a light-emitting layer of the first color light-emitting element of another second pixel may be integral with each other.

In an embodiment, a width of each of the two first display regions in the first direction may be greater than a width of the second display region.

In an embodiment of the disclosure, a deposition apparatus may include a first mask assembly including a first frame, and first masks physically connected to the first frame and disposed in a first direction, each of the first masks including first openings, a second mask assembly including a second frame, and second masks physically connected to the second frame and disposed in the first direction, each of the second masks including second openings, and a third mask assembly including a third frame, and third masks physically connected to the third frame and disposed in the first direction, each of the third masks including third openings. Adjacent first masks of the first masks may be spaced apart by a first distance in the first direction, adjacent second masks of the second masks may be spaced apart by a second distance in the first direction, and adjacent third masks of the third masks may be spaced apart by a third distance in the first direction. In a state in which the first mask assembly, the second mask assembly, and the third mask assembly may be stacked on each other, the first openings and the second openings may be aligned in a second direction intersecting the first direction, and the third openings may be spaced apart from the first openings and the second openings in the first direction.

In an embodiment, the first distance, the second distance, and the third distance may be different from one another.

In an embodiment, the first openings and the second openings may each define a n×m matrix, where n and m may be each a natural number equal to or greater than two.

In an embodiment, among the third openings, a third opening and another third opening adjacent to each other in the first direction may be staggered.

In an embodiment, a number of the third openings may be at least a half of the number of the first openings.

In an embodiment, the deposition apparatus may further include at least a chamber, a deposition source disposed inside the chamber, and a fixing member disposed inside the chamber, disposed on the deposition source, and fixing the first mask assembly, the second mask assembly, and the third mask assembly.

BRIEF DESCRIPTION OF THE FIGURES

The accompanying drawings are included to provide a further understanding of the disclosure, and are incorporated in and constitute a part of this specification. The drawings illustrate embodiments of the disclosure and, together with the description, serve to explain principles of the disclosure. In the drawings:

FIG. 5 is a schematic cross-sectional view of a deposition apparatus according to an embodiment of the disclosure;

FIG. 7D is a schematic plan view illustrating a second deposition operation of a manufacturing method of a display panel according to an embodiment of the disclosure;

DETAILED DESCRIPTION OF THE EMBODIMENTS

Figure 1:
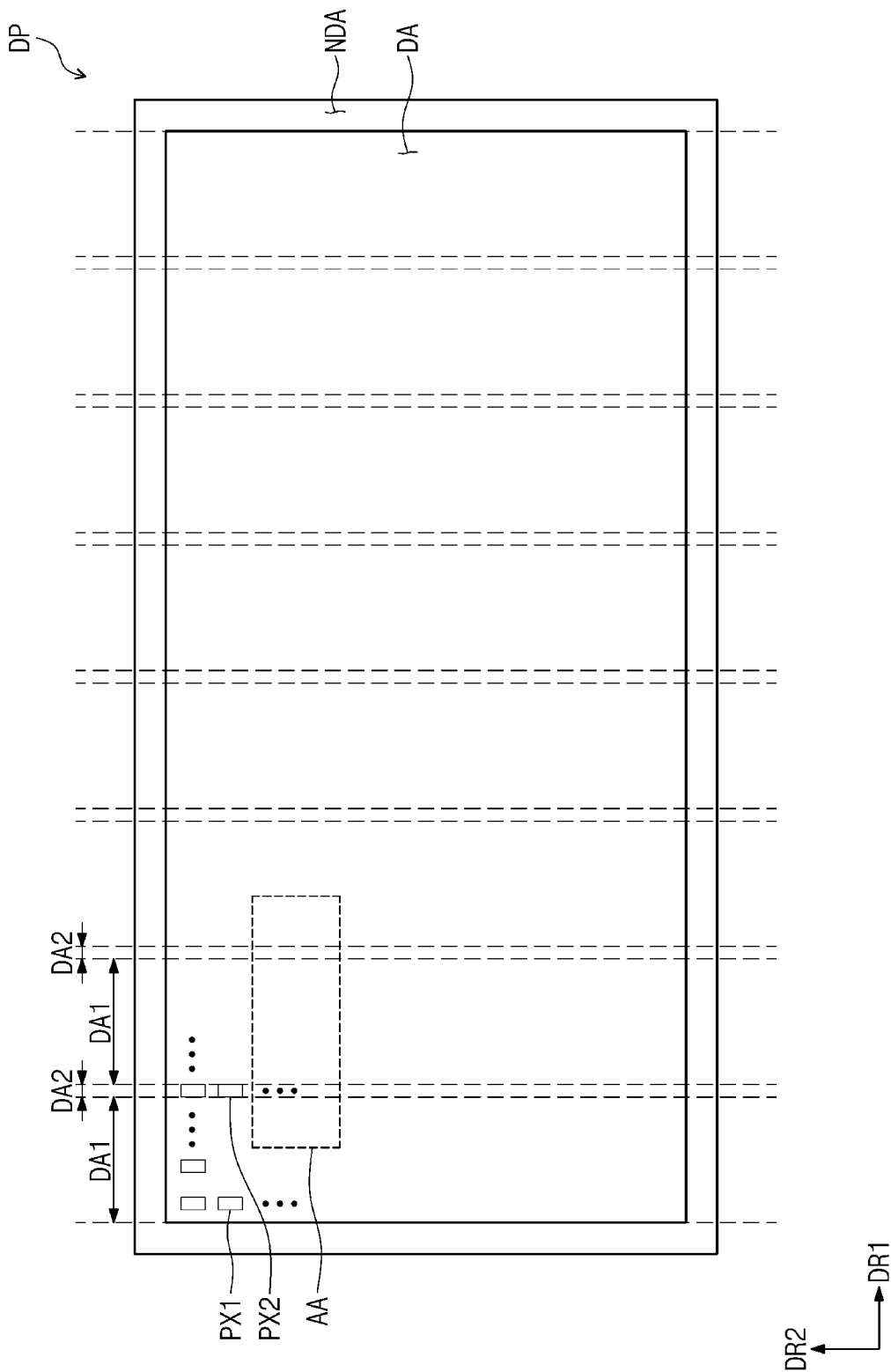
FIG. 1 is a schematic plan view of a display panel according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In this disclosure, when a component (or region, layer, portion, etc.) is referred to as "on", "connected", or "coupled" to another component, it means that it is placed/connected/coupled directly on the other component or that one or more additional components can be disposed therebetween.

The same reference numerals or symbols refer to the same elements. In addition, in the drawings, thicknesses, ratios, and dimensions of components may be exaggerated for effective description of technical content. "And/or" includes all combinations of one or more associated elements. For example, "A and/or B" may be understood to mean "A, B, or A and B." The terms "and" and "or" may be used in the conjunctive or disjunctive sense and may be understood to be equivalent to "and/or."

Terms such as first and second may be used to describe various components, but the components should not be limited by the terms. These terms are only used for the purpose of distinguishing one component from other components. For example, without departing from the scope of the invention, a first component may be referred to as a second component, and similarly, a second component may be referred to as a first component. Singular expressions include plural expressions (and vice versa) unless the context clearly indicates otherwise.

In addition, terms such as "below", "lower", "above", and "upper" are used to describe the relationship between components as shown in the drawings. The terms are relative concepts and are described based on the directions as indicated in the drawings. Embodiments should not be limited thereto. For example, "disposed on" may refer to a case of being disposed not only on an upper part of a member but also on a lower part.

Terms such as "comprise", "include", and "have" are intended to designate the presence of a feature, number, step, action, component, part, or combination thereof described in the specification, and it should be understood that these terms do not preclude the possibility of the presence or addition of one or more other features, numbers, steps, operations, components, parts, or combinations thereof.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. When an element is described as "not overlapping" or "to not overlap" another element, this may include that the elements are spaced apart from each other, offset from each other, or set aside from each other or any other suitable term as would be appreciated and understood by those of ordinary skill in the art.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

"About", "approximately", and "substantially" are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
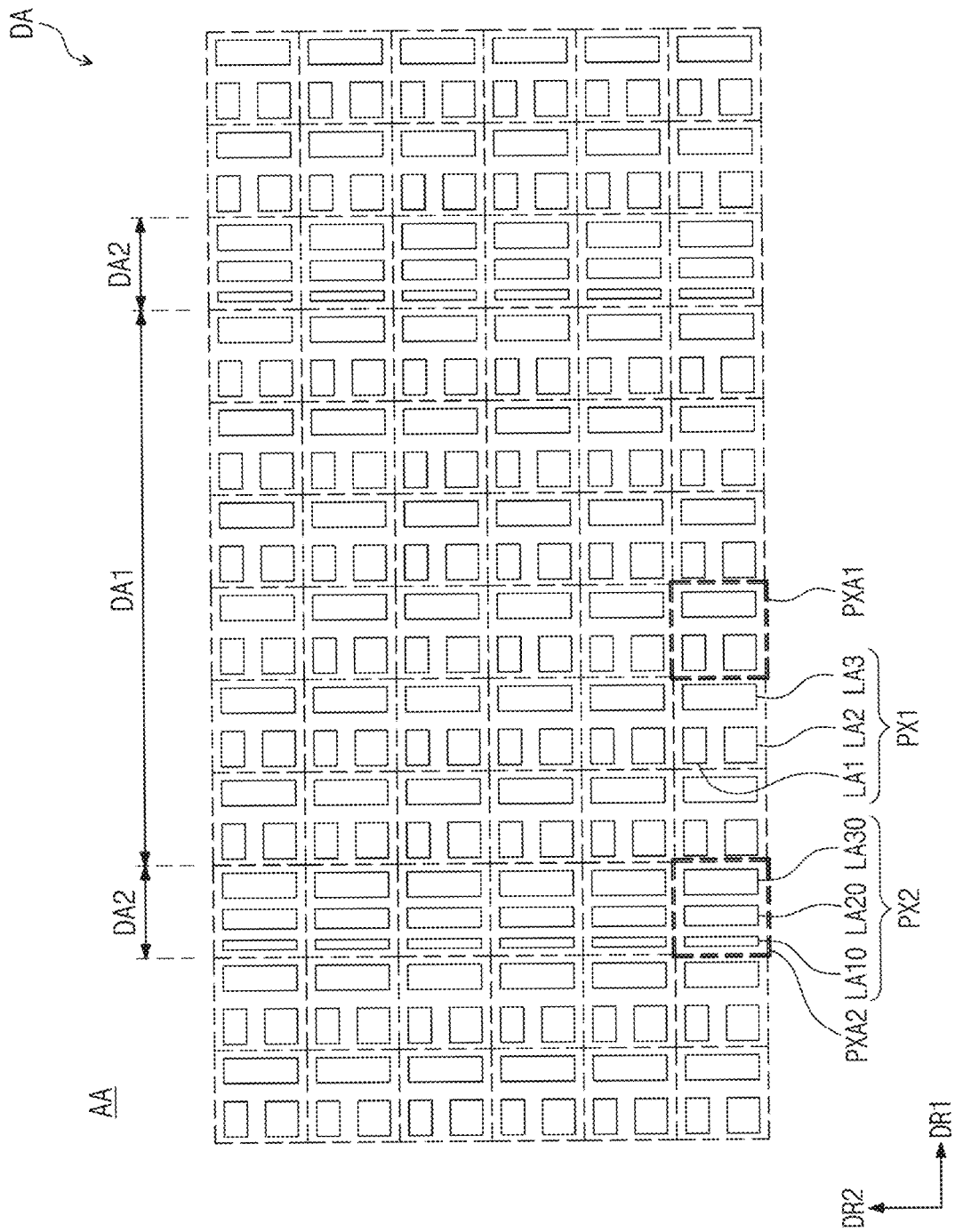
FIG. 2 is an enlarged schematic plan view of region AA in FIG. 1.
Figure 3:
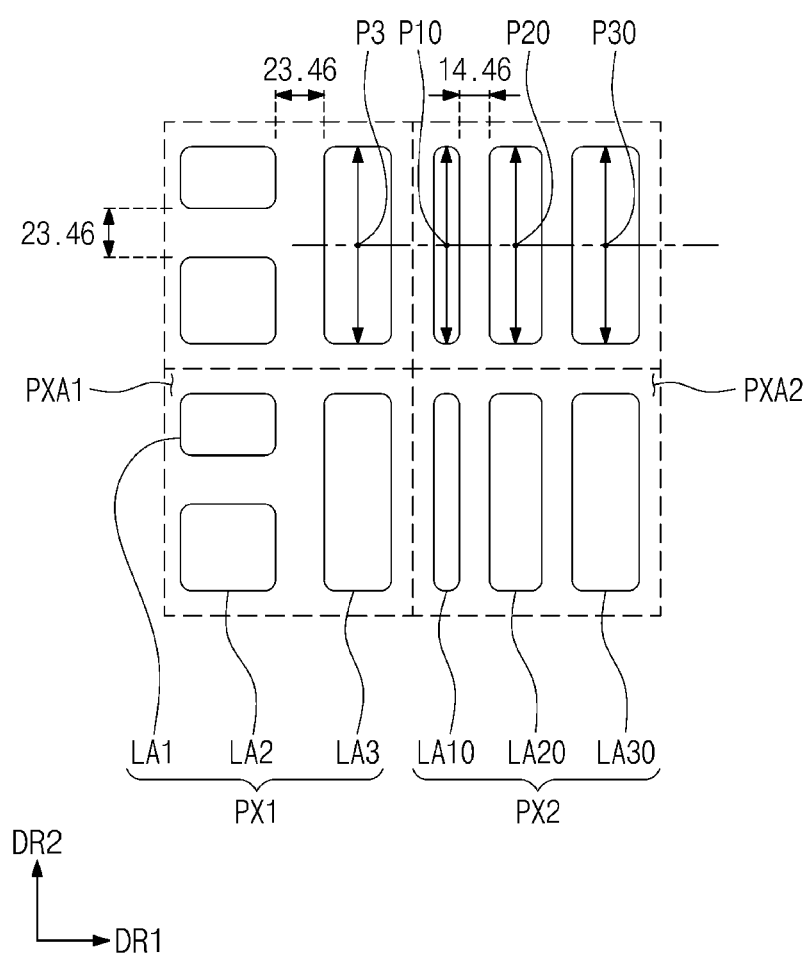
FIG. 3 is a schematic plan view illustrating a first pixel region and a second pixel region according to an embodiment of the disclosure.
Figure 4:
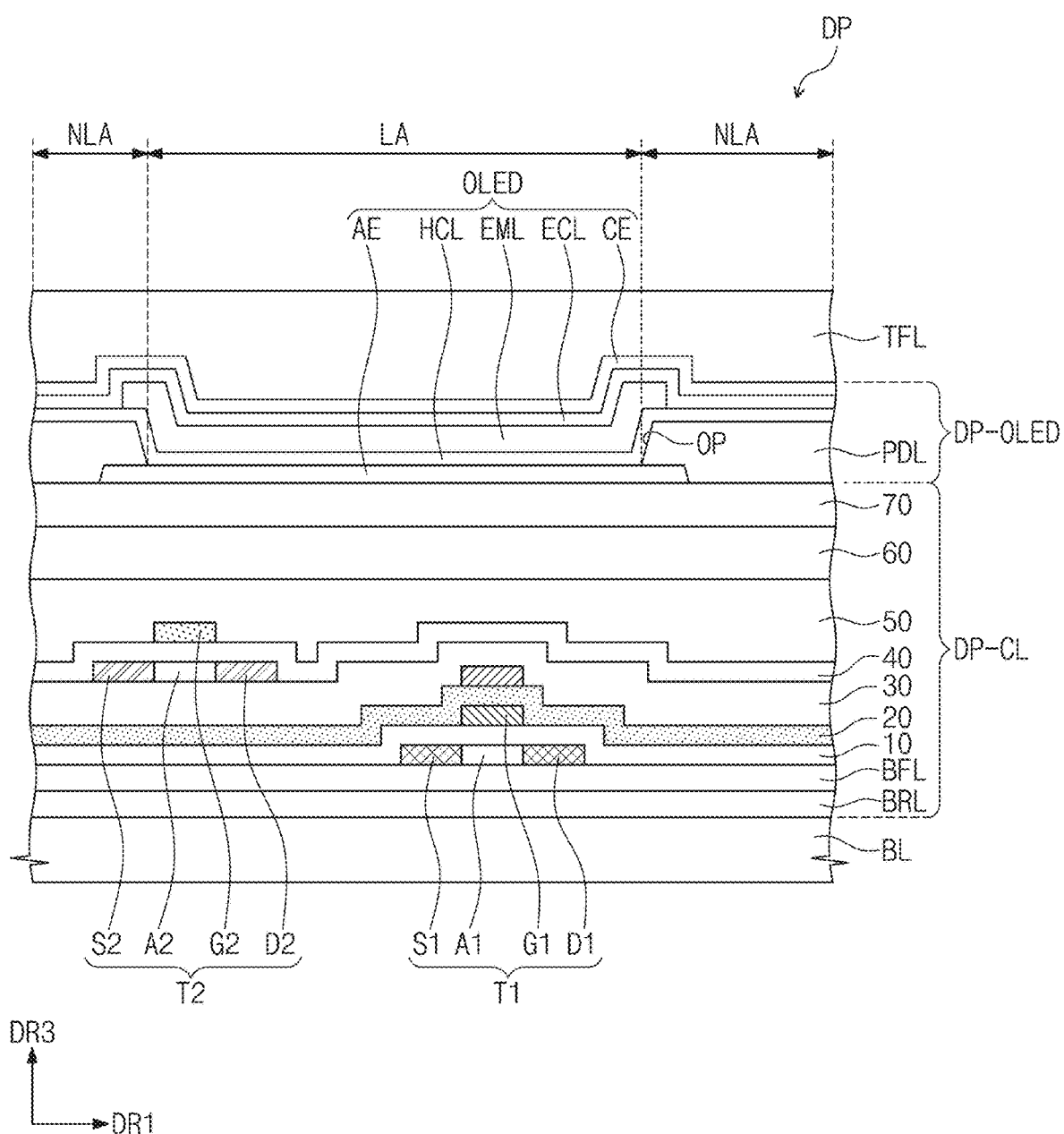
FIG. 4 is a schematic cross-sectional view of a display panel according to an embodiment of the disclosure.

FIG. 1 is a schematic plan view of a display panel DP according to an embodiment of the disclosure. FIG. 2 is an enlarged schematic plan view of region AA in FIG. 1. FIG. 3 is a schematic plan view illustrating a first pixel region PXA1 and a second pixel region PXA2 according to an embodiment of the disclosure. FIG. 4 is a schematic cross-sectional view of a display panel DP according to an embodiment of the disclosure.

The display panel DP illustrated in FIG. 1, which may be a light-emitting display panel, may be either an inorganic light-emitting display panel or an organic light-emitting display panel, but embodiments are not particularly limited thereto.

As illustrated in FIG. 1, the display panel DP may be parallel to a plane defined by a first directional axis DR1 and a second directional axis DR2. A normal direction of the display panel DP, for example, the thickness direction of the display panel DP, may indicate a third directional axis DR3. The front surface (or upper surface) and the rear surface (or lower surface) of each layer or unit to be described hereinafter may be defined on the basis of the third directional axis DR3. However, the first to third directional axes DR1, DR2, and DR3 illustrated in an embodiment are only examples. Hereinafter, first to third directions are defined as directions respectively indicated by the first to third directional axes DR1, DR2, and DR3, and denoted as the same reference numerals or symbols.

The display panel DP may include a display region DA and a non-display region NDA. A pixel may be disposed in the display region DA, and may not be disposed in the non-display region NDA. The non-display region NDA may be defined along the edge of the display panel DP. The non-display region NDA may surround the display region DA. In an embodiment of the disclosure, the non-display region NDA may be omitted, or may be disposed only on a side of the display region DA.

The display region DA may include multiple first display regions DA1 arranged in the first direction DR1. The first display regions DA1 may be disposed spaced apart in the first direction DR1. The display region DA may include multiple second display regions DA2 disposed between two adjacent first display regions DA1.

A width of each of the first display regions DA1 measured in the first direction DR1 may be greater than a width of each of the second display regions DA2. Substantially, each of the second display regions DA2 may correspond to a border region between the first display regions DA1. Multiple first pixels PX1 may be disposed in each of the first display regions DA1, and multiple second pixels PX2 may be disposed in each of the second display regions DA2.

A display panel DP is illustrated in an embodiment of the disclosure, but embodiments are not limited thereto. The display panel DP may include a curved display surface, or a three-dimensional display surface. The three-dimensional display surface may include multiple display regions indicating different orientations. The display panel DP may be a rollable display panel, a foldable display panel, or a slidable display panel. The display panel DP has a flexible property, and may be folded or rolled while being installed on a display apparatus.

Referring to FIG. 2, a first display region DA1 may include multiple first pixel regions PXA1, and a second display region DA2 may include multiple second pixel regions PXA2. A first pixel PX1 may be disposed in each of the first pixel regions PXA1, and a second pixel PX2 may be disposed in each of the second pixel regions PXA2.

The first pixel regions PXA1 and the second pixel regions PXA2 may have the same area. The first pixel regions PXA1 and the second pixel regions PXA2 may be only virtual regions obtained by dividing the first display regions DA1 and the second display regions DA2 into regions having the same area.

Multiple first pixels PX1, or the multiple first pixel regions PXA1 may be arranged in the first direction DR1 to form pixel rows, and may be arranged in the second direction DR2 to form pixel columns. The first pixels PX1 may define n×m pixel rows and pixel columns (where n and m may each be a natural number equal to or greater than 2). Multiple second pixels PX2, or the second pixel regions PXA2 may be arranged in the second direction DR2 to form a pixel column.

The first pixels PX1 and the second pixels PX2 may each include a first color pixel, a second color pixel, and a third color pixel. FIG. 2 illustrates that light-emitting regions LA1, LA2, LA3, LA10, LA20, and LA30 of the first color pixel, the second color pixel, and the third color pixel represent the first color pixel, the second color pixel, and the third color pixel. In an embodiment, the first color, the second color, and the third color may be red, green, and blue, but embodiments are not limited thereto.

Hereinafter, the arrangement of the light-emitting regions LA1, LA2, LA3, LA10, LA20, and LA30 of the first color pixel, the second color pixel, and the third color pixel may be defined as the same as the arrangement of the first color pixel, the second color pixel, and the third color pixel. The arrangement of the light-emitting regions LA1, LA2, LA3, LA10, LA20, and LA30 of the first color pixel, the second color pixel, and the third color pixel may be defined as the same as the arrangement of the light-emitting elements of the first color pixel, the second color pixel, and the third color pixel.

The first pixels PX1 may have the same arrangement of the first color pixel, the second color pixel, and the third color pixel. The second pixels PX2 may have the same arrangement of the first color pixel, the second color pixel, and the third color pixel. The arrangement of the first color pixel, the second color pixel, and the third color pixel in each of the first pixels PX1 may be different from the arrangement of the first color pixel, the second color pixel, and the third color pixel in each of the second pixels PX2.

A first light-emitting region LA10, a second light-emitting region LA20, and a third light-emitting region LA30 of each of the second pixels PX2 may be arranged in the first direction DR1. The first light-emitting regions LA10 of the second pixels PX2 may be aligned along the second direction DR2, the second light-emitting regions LA20 of the second pixels PX2 may be aligned along the second direction DR2, and the third light-emitting regions LA30 of the second pixels PX2 may be aligned along the second direction DR2.

A second light-emitting region LA2 of each of the first pixels PX1 may be disposed spaced apart from a first light-emitting region LA1 in the second direction DR2, and a third light-emitting region LA3 may be disposed spaced apart from the first light-emitting region LA1 in the first direction DR1. In an embodiment, the third light-emitting region LA3 may be disposed spaced apart from the second light-emitting region LA2 in the first direction DR1.

Referring to FIG. 3, first light-emitting regions LA1 and LA10, second light-emitting regions LA2 and LA20, and third light-emitting regions LA3 and LA30 each having a rectangular shape with a rounded corner are illustrated. However, embodiments are not limited thereto, and the light-emitting regions LA1, LA2, LA3, LA10, LA20, and LA30 may have a square, a rectangle, or any other polygonal shape in a mathematical sense.

It is illustrated that the first light-emitting region LA10, the second light-emitting region LA20, and the third light-emitting region LA30 of the second pixels PX2 have the same length in the second direction DR2, but embodiments are not limited thereto.

Referring to FIG. 3, the first light-emitting regions LA1 and LA10, the second light-emitting regions LA2 and LA20, and the third light-emitting regions LA3 and LA30 may have different areas. Referring to FIG. 3, each of the first light-emitting regions LA1 and LA10 has the smallest light-emitting area, and each of the third light-emitting regions LA3 and LA30 has the greatest light-emitting area, but embodiments are not limited thereto.

In the second pixel PX2, a center P10 in the second direction DR2 of the first light-emitting region LA10, a center P20 in the second direction DR2 of the second light-emitting region LA20, and a center P30 in the second direction DR2 of the third light-emitting region LA30, may be aligned in the first direction DR1, but embodiments are not limited thereto. The center P10 in the second direction DR2 of the first light-emitting region LA10, the center P20 in the second direction DR2 of the second light-emitting region LA20, and the center P30 in the second direction DR2 of the third light-emitting region LA30 may be aligned, in the first direction DR1, with a center P3 in the second direction DR2 of the third light-emitting region LA3 of the first pixel PX1, but embodiments are not limited thereto. The center of the light-emitting region described above may be defined as the same as a center of a light-emitting element.

FIG. 3 illustrates that the first light-emitting regions LA1 and LA10 have different shapes, the second light-emitting regions LA2 and LA20 have different shapes, and the third light-emitting regions LA3 and LA30 have a same shape, but embodiments are not limited thereto. FIG. 3 illustrates that the first light-emitting regions LA1 and LA10 have the same light-emitting area, the second light-emitting regions LA2 and LA20 have the same light-emitting area, and the third light-emitting regions LA3 and LA30 have the same light-emitting area, but embodiments are not limited thereto. The arrangement of light-emitting regions of the first pixels PX1 may be different from the arrangement of light-emitting regions of the second pixels PX2, thereby increasing the minimum distance between adjacent light-emitting regions.

In the first pixel PX1, the minimum distance between the first light-emitting region LA1 and the second light-emitting region LA2, and the minimum distance between the third light-emitting region LA3 and the first light-emitting region LA1 or second light-emitting region LA2 may be each about 23.46 µm, and, in the second pixel PX2, the minimum distance between the first light-emitting region LA10 and the second light-emitting region LA20, and the minimum distance between the third light-emitting region LA30 and the first light-emitting region LA10 or second light-emitting region LA20 may be each about 14.46 µm. It can be seen that the distance between adjacent light-emitting regions of the first pixel PX1 may be about 162% of the distance between adjacent light-emitting regions of the second pixel PX2.

A great minimum distance between adjacent light-emitting regions means a great process margin. This will be described in detail with reference to FIG. 4.

FIG. 4 illustrates a cross-section corresponding to one light-emitting region LA, and may be the same as a cross-section of each of the light-emitting regions LA1, LA2, LA3, LA10, LA20, and LA30 illustrated in FIG. 3.

As illustrated in FIG. 4, a display panel DP may include a base layer BL, a circuit element layer DP-CL disposed on the base layer BL, a display element layer DP-OLED disposed on the circuit element layer DP-CL, and an insulating layer TFL (hereinafter, defined as an upper insulating layer) disposed on the display element layer DP-OLED.

The base layer BL may include a synthetic resin layer. The synthetic resin layer may be formed on a supporting substrate used in manufacturing a display panel DP. A conductive layer, an insulating layer, etc., may be formed on the synthetic resin layer. In case that the supporting substrate is removed, the synthetic resin layer corresponds to the base layer BL.

The circuit element layer DP-CL may include at least an insulating layer and a circuit element. The circuit element may include a signal line, and a driving circuit of a pixel. The circuit element layer DP-CL may be formed through a process of forming an insulating layer, a semiconductor layer, and a conductive layer by coating, deposition, etc., and a process of patterning the insulating layer, the semiconductor layer, and the conductive layer by a photography process.

In an embodiment, the circuit element layer DP-CL may include a buffer layer BFL, a barrier layer BRL, and first to seventh insulating layers 10 to 70. The buffer layer BFL, the barrier layer BRL, and the first to seventh insulating layers 10 to 70 may include at least one of an inorganic film and an organic film. The buffer layer BFL and the barrier layer BRL may include an inorganic film. At least one of the fifth to seventh insulating layers (50 to 70) may include an organic film.

FIG. 4 illustrates an arrangement relationship of a first active area A1, a second active area A2, a first gate G1, a second gate G2, a first source S1, a second source S2, a first drain D1, and a second drain D2 which may respectively constitute a first transistor T1 and a second transistor T2. In an embodiment, the first active area A1 and the second active area A2 may include different materials. The first active area A1 may include a polysilicon semiconductor, and the second active area A2 may include a metal oxide semiconductor. The first source S1 and the first drain D1 may be regions each having a higher doping concentration than the first active area A1, and serve as electrodes. The second source S2 and the second drain D2 may be regions in which a metal oxide semiconductor may be reduced, and serve as electrodes.

In an embodiment of the disclosure, the first active area A1 and the second active area A2 may include the same semiconductor material, and the stack structure of the circuit element layer DP-CL may be further simplified.

The display element layer DP-OLED may include a pixel-defining film PDL and a light-emitting element OLED. The light-emitting element OLED may be an organic light-emitting diode, or a quantum dot light-emitting diode. A first electrode AE may be disposed on the seventh insulating layer 70. An opening OP of the pixel-defining film PDL may expose at least a portion of the first electrode AE. The opening OP of the pixel-defining film PDL may define a light-emitting region LA. The arrangement of the light-emitting region LA may represent the arrangement of the first electrode AE. A non-light-emitting region NLA may surround the light-emitting region LA.

A hole control layer HCL and an electron control layer ECL may be disposed, in common, on the light-emitting region LA and the non-light-emitting region NLA. A light-emitting layer EML may be provided in a pattern shape so as to correspond to the opening OP. The light-emitting layer EML may be deposited in a way different from the hole control layer HCL and the electron control layer ECL which have a film shape. A mask assembly may be used for forming the light-emitting layer EML having a shape.

Even in case that the light-emitting layer EML is deposited while being shifted from a target point due to misalignment, the light-emitting layer EML may be deposited only in the non-light-emitting region NLA in case of a high process margin, thereby preventing the light-emitting layer EML from being deposited in another light-emitting region LA. In case of a high process margin, a mask may be designed such that the light-emitting layer EML may be deposited onto a region wider than the light-emitting region LA, whereby the light-emitting layer EML may be deposited such that the light-emitting layer EML sufficiently covers a targeted light-emitting region LA in spite of misalignment.

The hole control layer HCL and the electron control layer ECL may be formed, in common, on multiple pixels by using an open mask. The light-emitting layer EML may be formed differently according to the light-emitting region LA by using a mask referred to as a fine metal mask (FMM).

An upper insulating layer TFL may be disposed on the light-emitting element OLED. The upper insulating layer TFL may include multiple thin films. The thin films may include an inorganic film and an organic film. The upper insulating layer TFL may include an insulating layer for encapsulating the display element layer DP-OLED, an insulating layer for improving light output efficiency, etc.

FIG. 5 is a schematic cross-sectional view of a deposition apparatus EDA according to an embodiment of the disclosure. The deposition apparatus EDA according to an embodiment may be used in a deposition process of a light-emitting layer EML in FIG. 4.

As illustrated in FIG. 5, the deposition apparatus EDA according to an embodiment of the disclosure may include a deposition chamber CB, a fixing member CM, a deposition source DS disposed inside the deposition chamber CB, and a mask assembly MSA disposed inside the deposition chamber CB. Although not illustrated separately, the deposition apparatus EDA may further include an additional machine for implementing an inline system.

In the deposition chamber CB, a deposition condition may be set as a vacuum condition. The deposition chamber CB may include a bottom surface, a ceiling surface, and sidewalls. The bottom surface of the deposition chamber CB may be parallel to a plane defined by a first directional axis DR1 and a second directional axis DR2. The normal direction of the bottom surface of the deposition chamber CB may indicate a third directional axis DR3.

The fixing member CM may be disposed inside the deposition chamber CB, disposed on the deposition source DS, and may fix the mask assembly MSA. The fixing member CM may be installed on the ceiling surface of the deposition chamber CB. The fixing member CM may include a jig or a robot arm for holding the mask assembly MSA.

The fixing member CM may include a body portion BD, and magnetic substances MM physically connected to the body portion BD. The body portion BD may include a plate as a basic structure for fixing the mask assembly MSA, but embodiments are not limited thereto. The magnetic substances MM may be disposed inside or outside the body portion BD. The magnetic substances MM may fix the mask assembly MSA with magnetic force.

The deposition source DS may evaporate a deposition material such as a light-emitting material, and eject such as a deposition vapor. The deposition vapor may pass through the mask assembly MSA, and may be deposited, in a pattern, onto a work substrate WS. The work substrate WS may be defined as a substrate in the intermediate stage of manufacturing the display panel DP described with reference to FIGS. 1 to 4.

The mask assembly MSA may be disposed inside the deposition chamber CB, disposed on the deposition source DS, and may support the work substrate WS. The work substrate WS may include a glass substrate or a plastic substrate. The work substrate WS may include a polymer layer disposed on a base substrate. In a latter process of a manufacturing process of a display panel, the base substrate may be removed, and the polymer layer may correspond to the base layer BL in FIG. 4.

Figure 6A:
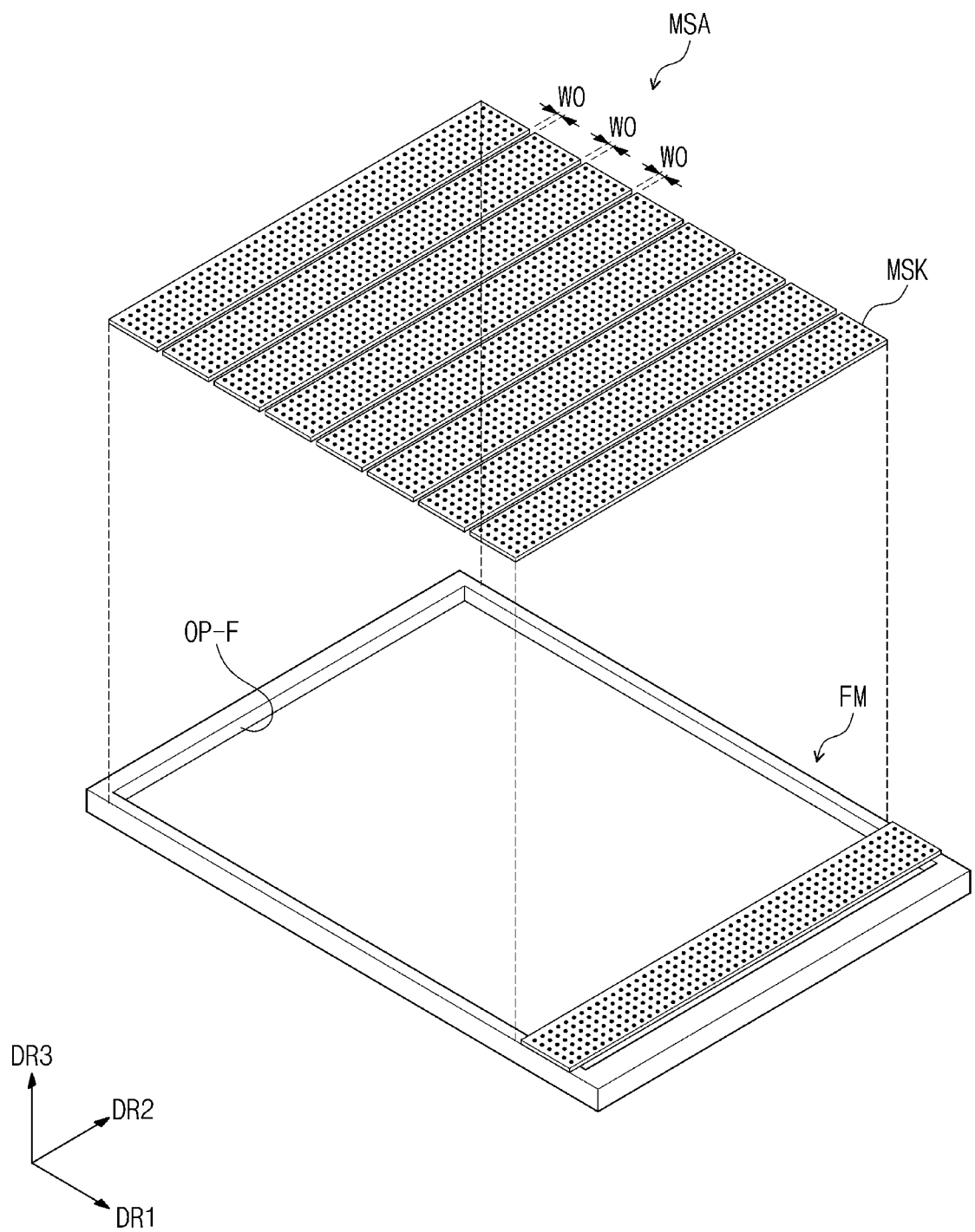
FIG. 6A is a schematic perspective view of a mask assembly according to an embodiment of the disclosure.
Figure 6B:
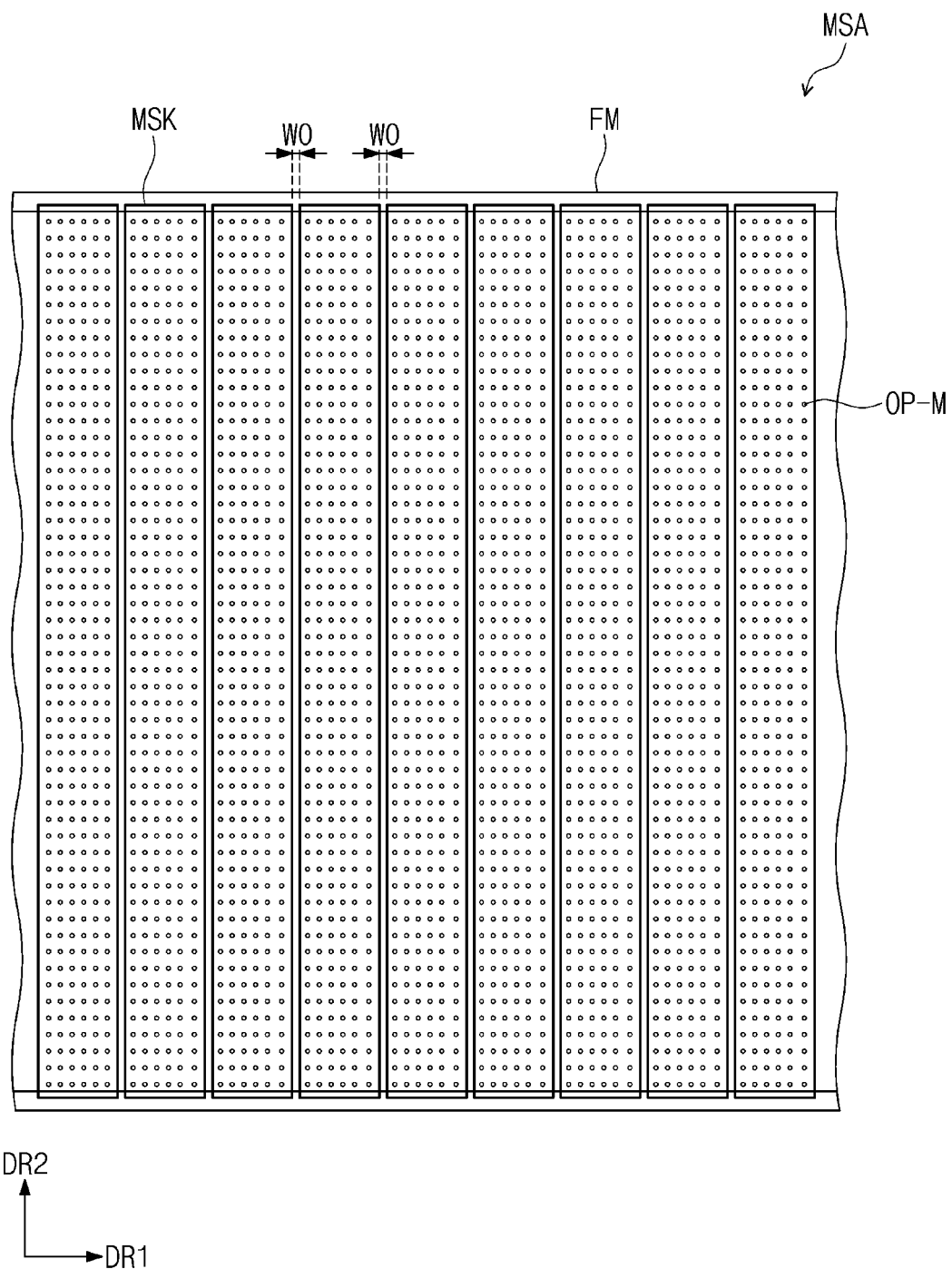
FIG. 6B is a schematic plan view of a mask assembly according to an embodiment of the disclosure.

FIG. 6A is a schematic perspective view of a mask assembly MSA according to an embodiment of the disclosure. FIG. 6B is a schematic plan view of the mask assembly MSA according to an embodiment of the disclosure.

As illustrated in FIGS. 6A and 6B, the mask assembly MSA may include a frame FM and multiple masks MSK.

An opening OP-F may be defined inside the frame FM. The frame FM may have a rectangular shape in a plan view. The shape of the frame FM is not particularly limited, and is sufficiently good as long as the frame FM may be capable of supporting the masks MSK.

In an embodiment, a frame FM including a single opening OP-F is illustrated, but the frame FM may include multiple openings OP-F. Multiple masks MSK may be disposed for each opening OP-F. The work substrate WS may include multiple unit regions. The multiple unit regions may correspond to the multiple openings OP-F, respectively. The display panel DP (see FIG. 1) may be formed from each of the multiple unit regions. In a latter process of a manufacturing process, the unit regions may be divided into multiple display panels DP.

The frame FM may be composed of a metal material. For example, the frame FM may include nickel (Ni), a nickel-cobalt alloy, a nickel-iron alloy, etc., or a combination thereof.

The masks MSK may be disposed on the frame FM. The masks MSK may be physically connected to the frame FM by welding. The masks MSK may each extend in the second direction DR2, and be arranged in the first direction DR1. The masks MSK may include, as a material thereof, invar having a small thermal expansion coefficient. For example, the masks MSK may include nickel (Ni), a nickel-cobalt alloy, a nickel-iron alloy, etc., or a combination thereof.

Multiple openings OP-M may be defined in each of the masks MSK. Deposition vapor provided by the deposition source DS (see FIG. 5) may pass through the multiple openings OP-M, and may be deposited, in a pattern, onto the work substrate WS.

As the masks MSK in which the openings OP-M may be formed may have greater sizes, sagging or deformation thereof may be more likely to occur. The sagging or deformation of the masks MSK may cause the defect (for example, misalignment) of deposition patterns. According to an embodiment, multiple masks MSK may replace a single large-sized mask, and therefore the sagging or deformation of a mask may be prevented.

Adjacent masks MSK in the first direction DR1 may be spaced apart by a distance W0. The reason why the masks MSK may be spaced apart may be to form a line-deposition region on the work substrate WS. A detailed description thereof will be provided later.

In case that the masks MSK are successively disposed, a non-deposition region on the border region between the masks MSK becomes larger, which may make it difficult to form a uniform deposition pattern. In case that non-opening regions of the masks MSK are reduced to reduce the border region between the masks MSK, deformation of the masks MSK may be likely to occur. Accordingly, there may be limitation in reducing the border region between the masks MSK.

A deposition apparatus according to an embodiment of the disclosure may include multiple mask assemblies MSA illustrated in FIGS. 6A and 6B. The mask assemblies MSA include masks MSK in which the openings OP-M arranged according to different rules may be formed. The number of mask assemblies MSA may be determined depending on the number of targeted deposition patterns.

Hereinafter, FIGS. 7A to 7G illustrate three kinds of mask assemblies MSA1, MSA2, and MSA3 used to form three kinds of light-emitting layers. A manufacturing method of a display panel DP according to an embodiment of the disclosure will be described with reference to FIGS. 7A to 7G.

Figure 7A:
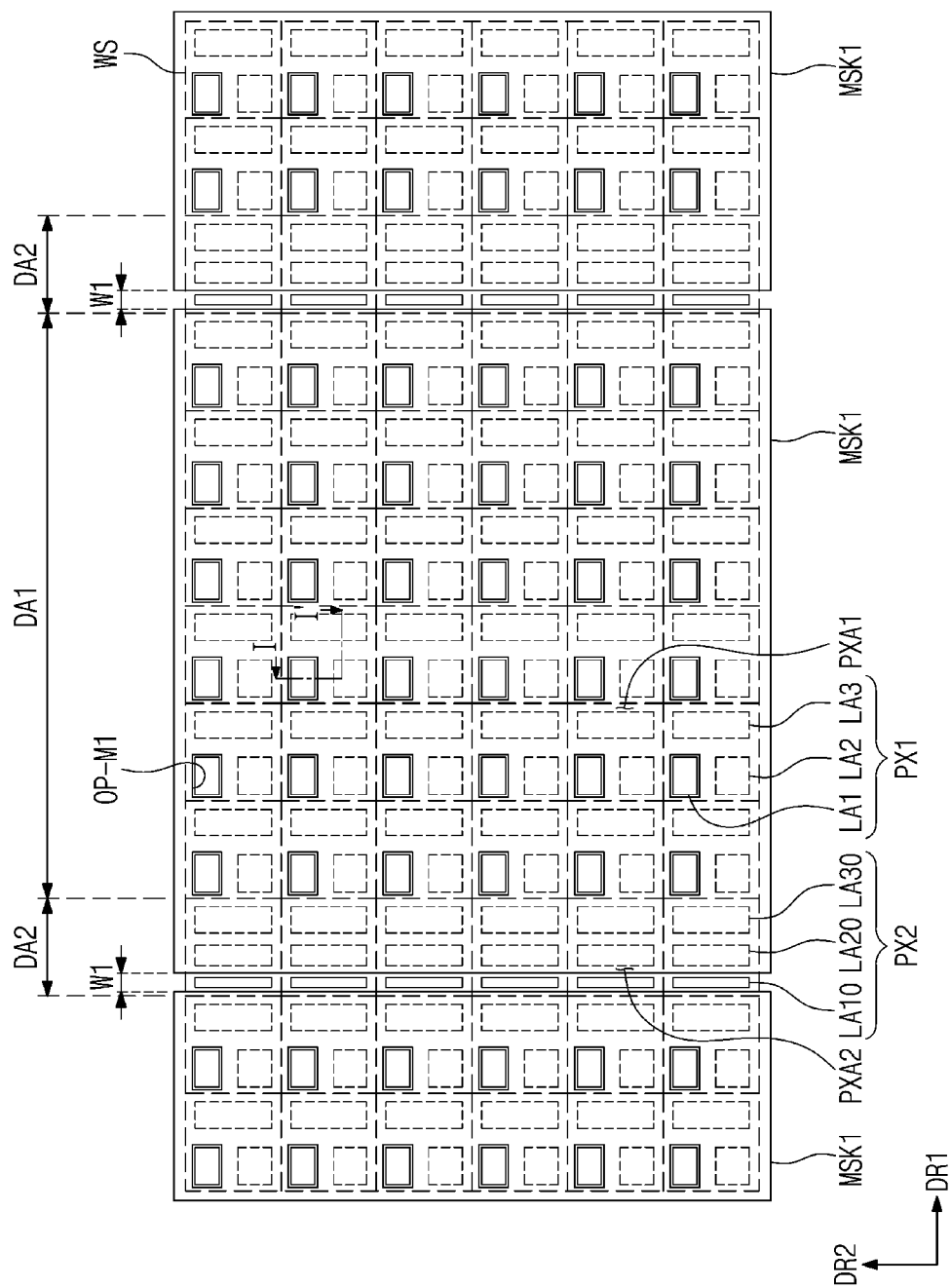
FIG. 7A is a schematic plan view illustrating a first deposition operation of a manufacturing method of a display panel according to an embodiment of the disclosure.
Figure 7B:
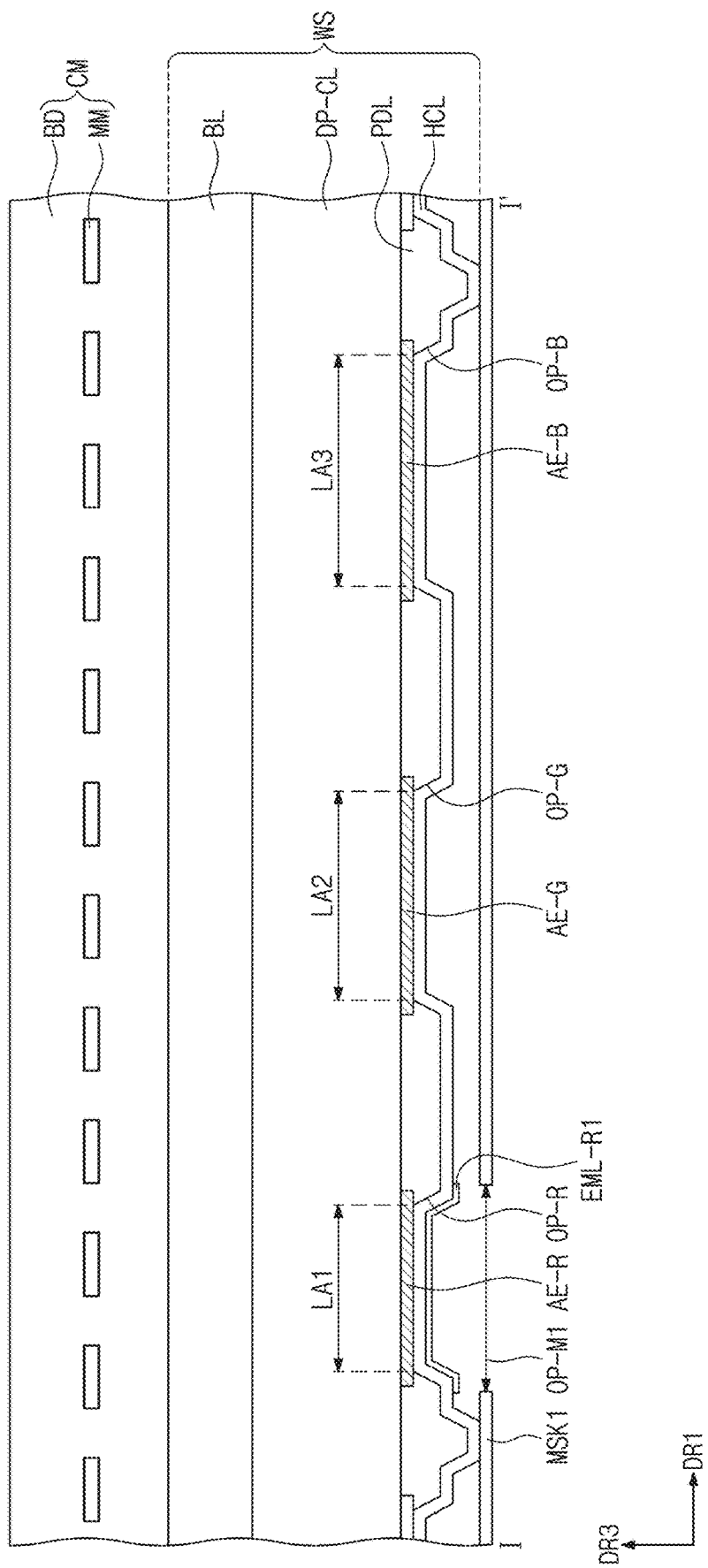
FIG. 7B is a schematic side view illustrating a first deposition operation of a manufacturing method of a display panel according to an embodiment of the disclosure.
Figure 7C:
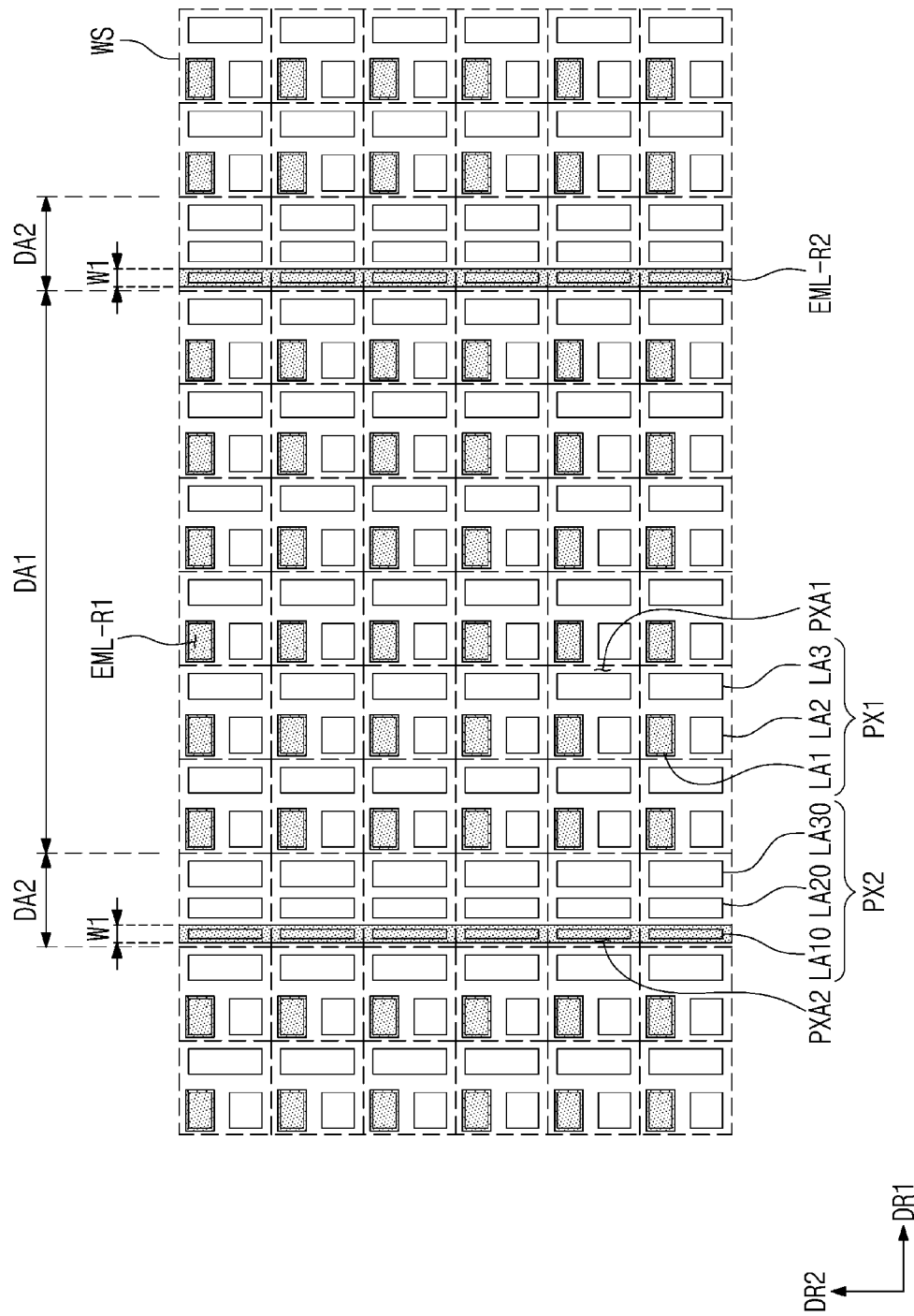
FIG. 7C is a schematic plan view illustrating a work substrate which has been subjected to a first deposition operation of a manufacturing method of a display panel according to an embodiment of the disclosure.
Figure 7E:
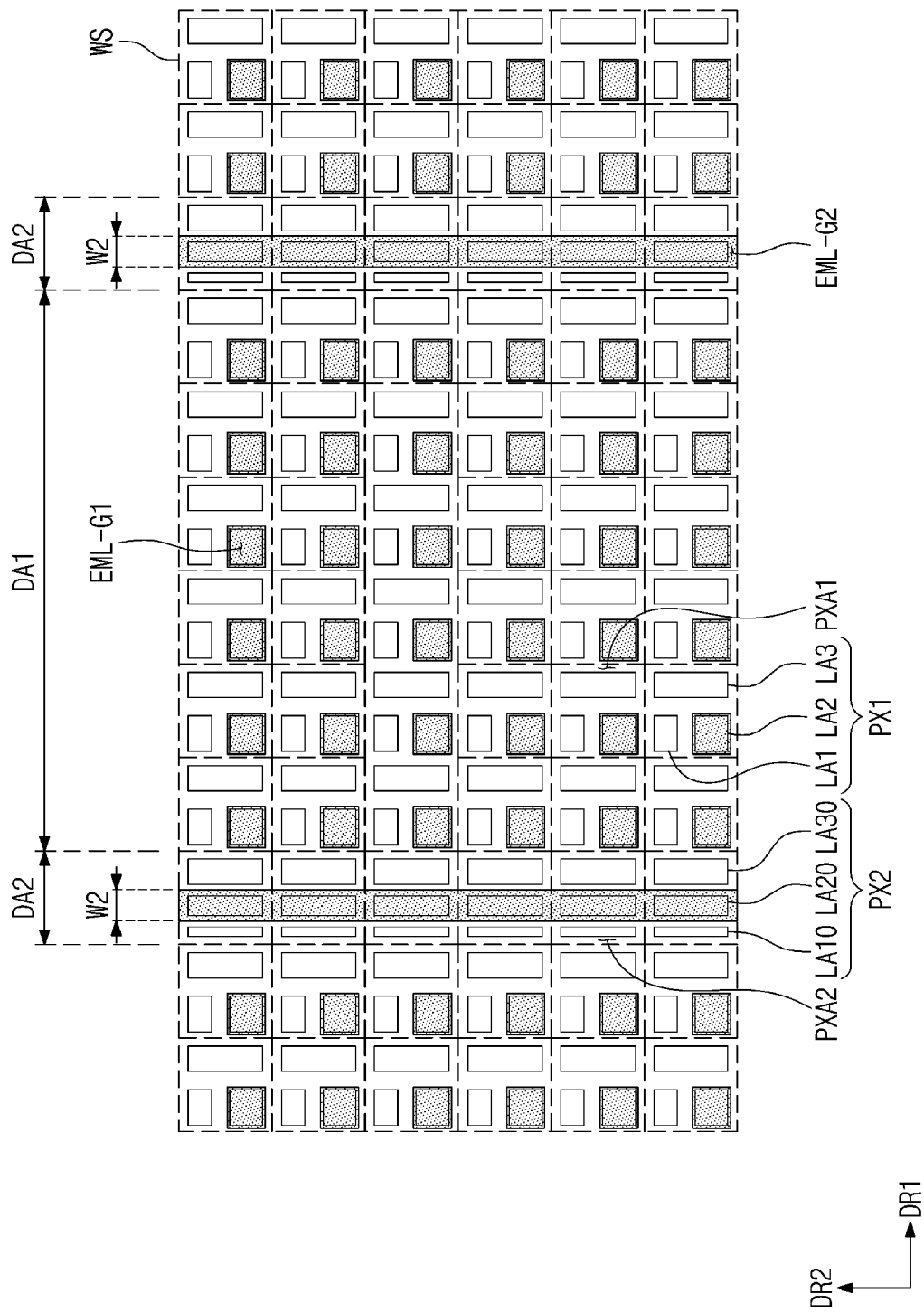
FIG. 7E is a schematic plan view illustrating a work substrate which has been subjected to a second deposition operation of a manufacturing method of a display panel according to an embodiment of the disclosure.
Figure 7F:
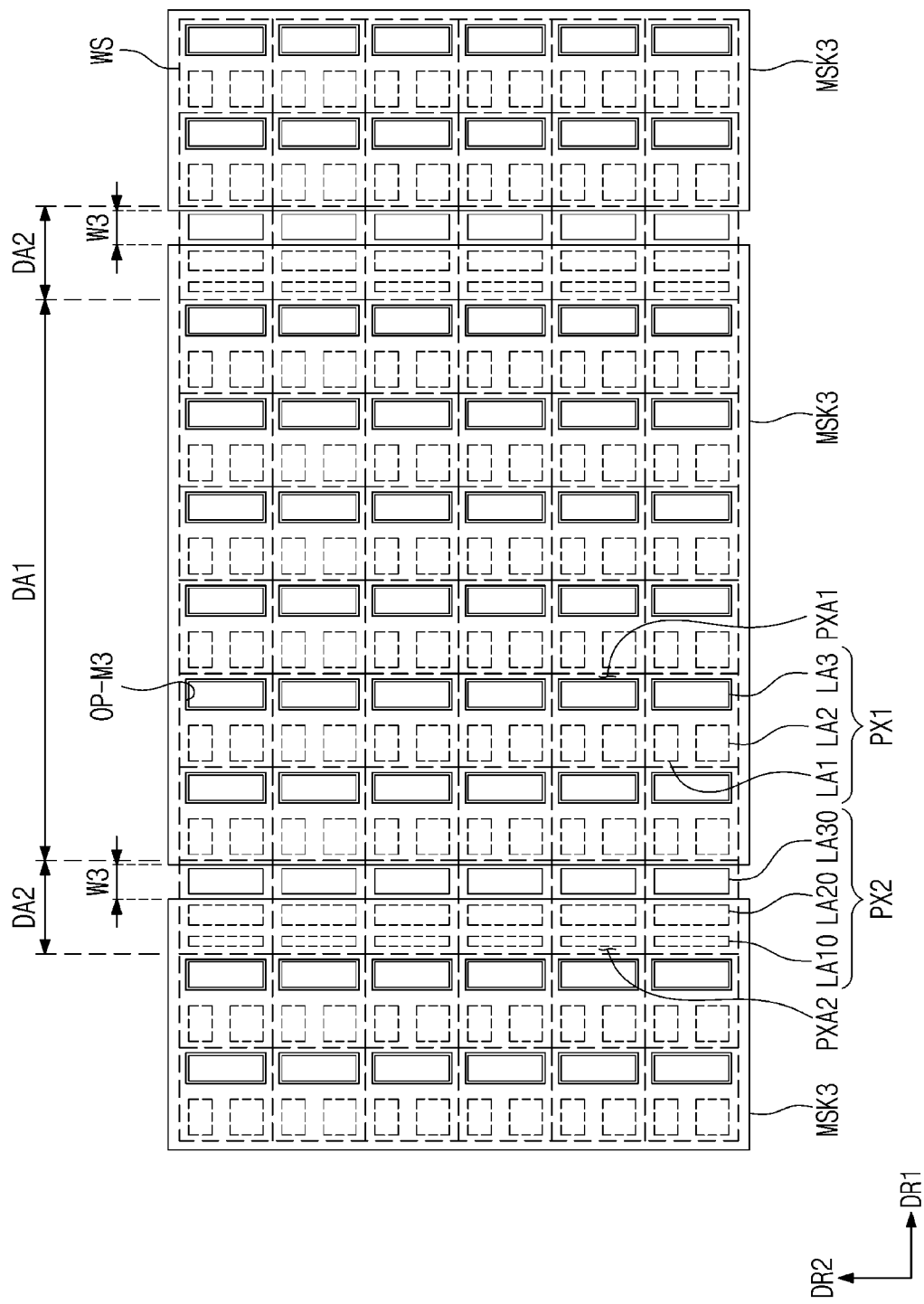
FIG. 7F is a schematic plan view illustrating a third deposition operation of a manufacturing method of a display panel according to an embodiment of the disclosure.
Figure 7G:
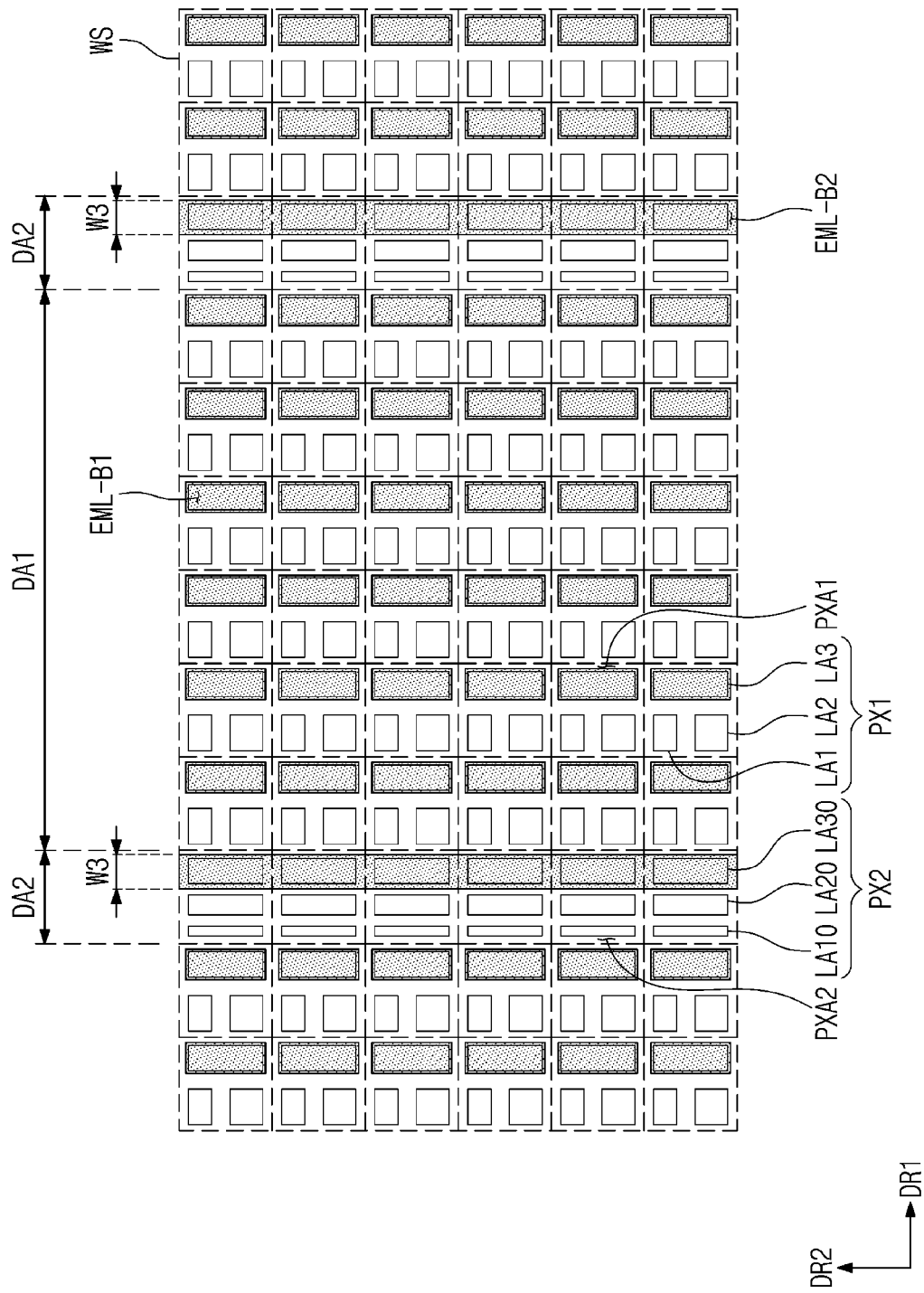
FIG. 7G is a schematic plan view illustrating a work substrate which has been subjected to a third deposition operation of a manufacturing method of a display panel according to an embodiment of the disclosure.

FIG. 7A is a schematic plan view illustrating a first deposition operation of a manufacturing method of a display panel DP according to an embodiment of the disclosure. FIG. 7B is a schematic side view illustrating the first deposition operation of a manufacturing method of a display panel DP according to an embodiment of the disclosure. FIG. 7C is a schematic plan view illustrating a work substrate WS which has been subjected to a first deposition operation of the manufacturing method of a display panel DP according to an embodiment of the disclosure. FIG. 7D is a schematic plan view illustrating a second deposition operation of a manufacturing method of a display panel DP according to an embodiment of the disclosure. FIG. 7E is a schematic plan view illustrating a work substrate WS which has been subjected to a second deposition operation of a manufacturing method of a display panel DP according to an embodiment of the disclosure. FIG. 7F is a schematic plan view illustrating a third deposition operation of a manufacturing method of a display panel DP according to an embodiment of the disclosure. FIG. 7G is a schematic plan view illustrating a work substrate WS which has been subjected to a third deposition operation of a manufacturing method of the display panel DP according to an embodiment of the disclosure.

Figure 8:
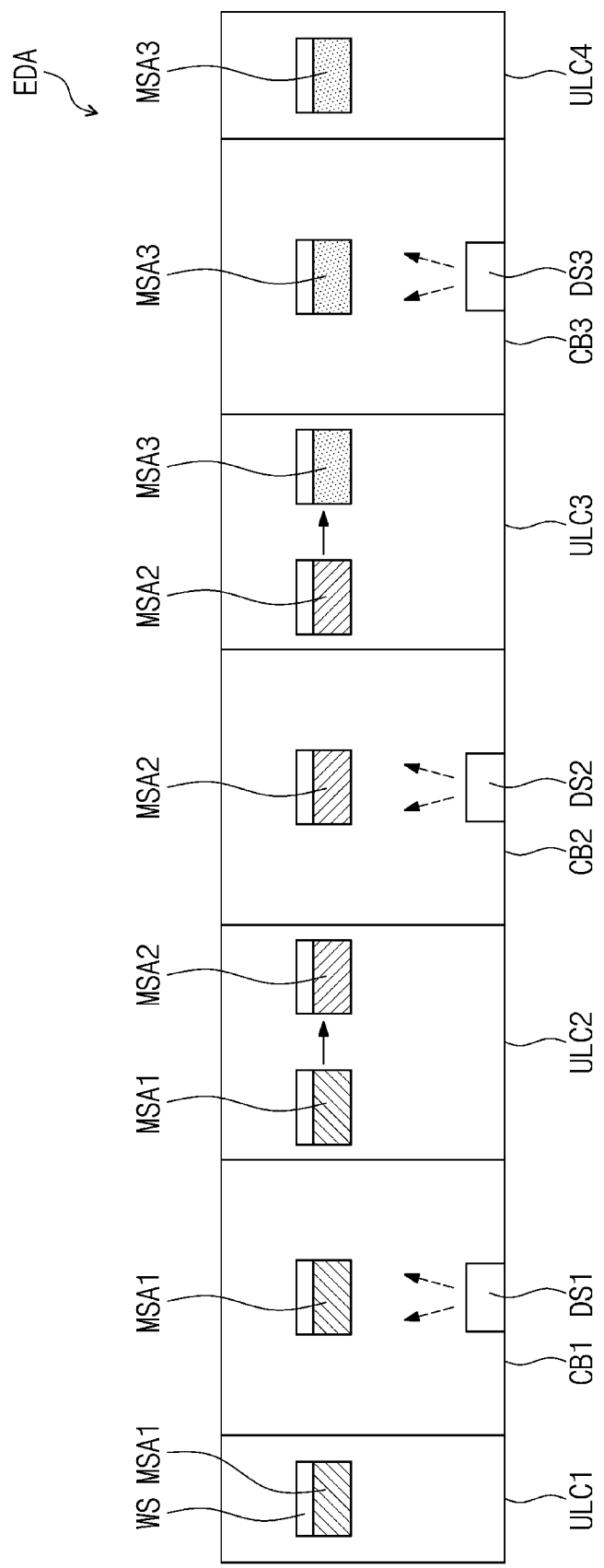
FIG. 8 is a schematic cross-sectional view of a deposition apparatus according to an embodiment of the disclosure.

Referring to FIGS. 7A and 7B, the first deposition operation may be performed in a state in which first masks MSK1 of a first mask assembly MSA1 may be aligned on the work substrate WS (see FIG. 8). The first masks MSK1 may be disposed spaced apart by a first distance W1 in a second display region DA2 of the work substrate WS.

First openings OP-M1 of each of the first masks MSK1 may be arranged according to a first rule. The first openings OP-M1 may define an n×m matrix (where n and m may each be a natural number equal to or greater than 2).

The first mask MSK1 may overlap second and third light-emitting regions LA2 and LA3 of a first display region DA1, and second and third light-emitting regions LA20 and LA30 of the second display region DA2. The first openings OP-M1 may overlap first light-emitting regions LA1 of the first display region DM. Substantially, the first openings OP-M1 may have a greater area than the first light-emitting region LA1. Spaced regions between adjacent first masks MSK1 may correspond to first light-emitting regions LA10 of the second display region DA2. The spaced regions between the adjacent first masks MSK1 may correspond to the line-deposition regions described above. Hereinafter, the line-deposition regions in a first deposition operation may be defined as first line-deposition regions.

FIG. 7B illustrates first electrodes AE-R, AE-G, and AE-B corresponding to first, second, third light-emitting regions LA1, LA2, and LA3, and openings OP-R, OP-G, and OP-B of pixel-defining films PDL. FIG. 7B additionally illustrates a fixing member CM (see FIG. 5) described already. A first light-emitting layer EML-R1 may be formed on a hole control layer HCL using the first mask MSK1 in FIG. 7B.

Referring to FIG. 7C, the first light-emitting layer EML-R1 may be deposited on each of the first light-emitting regions LA1 of the first display region DA1 through the first openings OP-M1. A first light-emitting layer EML-R2 may be deposited on the second display region DA2 through the line-deposition region. The first light-emitting layer EML-R2 of the second display region DA2 may have, in the second display region DA2, an integrated shape and a line shape extending in the second direction DR2. For example, adjacent first light-emitting regions LA10 in the second display region DA2 include the first light-emitting layer EML-R2 with an integrated shape.

Referring to FIG. 7D, the second deposition operation may be performed in a state in which the second masks MSK2 of the second mask assembly MSA2 may be aligned on a work substrate WS (see FIG. 8). The second masks MSK2 may be disposed spaced apart by a second distance W2 in the second display region DA2 of the work substrate WS. FIGS. 7D and 7E do not illustrate the first light-emitting layers EML-R1 and EML-R2 formed in the first deposition operation described already.

Second openings OP-M2 of each of the second masks MSK2 may be arranged according to a second rule. The second openings OP-M2 may define an n×m matrix (where n and m may each be a natural number equal to or greater than 2).

The second mask MSK2 may overlap the first and third light-emitting regions LA1 and LA3 of the first display region DA1, and the first and third light-emitting regions LA10 and LA30 of the second display region DA2. The second openings OP-M2 may overlap the second light-emitting regions LA2 of the first display region DM. Spaced regions (hereinafter, second line-deposition regions) between adjacent second masks MSK2 may correspond to second light-emitting regions LA20 of the second display region DA2.

Referring to FIG. 7E, a second light-emitting layer EML-G1 is may be deposited on each of the second light-emitting region LA2 of the first display region DA1 through the second openings OP-M2. A second light-emitting layer EML-G2 may be deposited on the second display region DA2 through the second line-deposition region. The second light-emitting layer EML-G2 of the second display region DA2 may have an integrated shape, and a line shape extending in the second direction DR2. Adjacent second light-emitting region LA20 in the second display regions DA2 may include the second light-emitting layer EML-G2 with an integrated shape.

Referring to FIG. 7F, the third deposition operation may be performed in a state in which the third masks MSK3 of the third mask assembly MSA3 may be aligned on the work substrate WS (see FIG. 8). The third masks MSK3 may be disposed spaced apart by a third distance W3 in the second display region DA2 of the work substrate WS. FIGS. 7F and 7G do not illustrate the first light-emitting layers EML-R1 and EML-R2 formed in the first deposition operation, and the second light-emitting layers EML-G1 and EML-G2 formed in the second deposition operation, which have been described already.

The third openings OP-M3 of each of the third masks MSK3 may be arranged according to a third rule. The third openings OP-M3 may define an n×m matrix (where n and m may each be a natural number equal to or greater than 2).

The third masks MSK3 may overlap first and second light-emitting regions LA1 and LA2 of the first display region DA1, and first and second light-emitting regions LA10 and LA20 of the second display region DA2. The third openings OP-M3 may overlap the third light-emitting regions LA3 of the first display regions DA1. Spaced regions between adjacent third masks MSK3 (hereinafter, third line-deposition regions) may correspond to the third light-emitting regions LA30 of the second display regions DA2.

Referring to FIG. 7G, a third light-emitting layer EML-B1 may be deposited on each of the third light-emitting regions LA3 of the first display region DA1 through the third openings OP-M3. A third light-emitting layer EML-B2 may be deposited on the second display region DA2 through the third line-deposition region. The third light-emitting layer EML-B2 may have, in the second display region DA2, an integrated shape, and a line shape extending in the second direction DR2. Adjacent third light-emitting regions LA30 in the second display region DA2 may include the third light-emitting layer EML-B2 with an integrated shape.

Referring to FIGS. 7A to 7G, the first distance W1, the second distance W2, and the third distance W3 may be different. After the widths of the first light-emitting layer EML-R2, the second light-emitting layer EML-G2, and the third light-emitting layer EML-B2 disposed in the second display region DA2 may be set, the first distance W1, the second distance W2, and the third distance W3 may be determined according to the set widths.

In a state in which the first mask assembly MSA1, the second mask assembly MSA2, and the third mask assembly MSA3 may be stacked on each other, the first openings OP-M1, the second openings OP-M2, and the third openings OP-M3 may not overlap each other. The arrangement of the first openings OP-M1, the second openings OP-M2, and the third openings OP-M3 may be substantially the same as the arrangement of the first light-emitting regions LA1, the second light-emitting regions LA2, and the third light-emitting regions LA3. The first openings OP-M1 and the second openings OP-M2 may be aligned in the second direction DR2, and the third openings OP-M3 may be spaced apart from the first openings OP-M1 and the second openings OP-M2 in the first direction DR1.

FIG. 8 is a schematic cross-sectional view of a deposition apparatus EDA according to an embodiment of the disclosure. The deposition apparatus EDA according to an embodiment may be operated by an inline system. FIG. 8 does not illustrate a mechanical apparatus (hereinafter, a holding apparatus) that holds mask assemblies MSA1 to MSA3, a mechanical apparatus that moves the mask assemblies MSA1 to MSA3, and a mechanical apparatus that separates the work substrate WS from the mask assemblies MSA1 to MSA3.

The deposition apparatus EDA may include first to fourth unloading/loading chambers ULC1 to ULC4, and first to third deposition chambers CB1 to CB3. The first to third deposition chambers CB1 to CB3 may be substantially the same as chambers illustrated in FIG. 5, respectively.

The mask assemblies MSA1 to MSA3 in FIG. 8 may correspond to the mask assemblies MSA1 to MSA3 described in FIGS. 7A to 7G. First to third deposition sources DS1 to DS3 may be disposed inside the first to third deposition chambers CB1 to CB3, respectively. For example, the first to third deposition chambers CB1 to CB3 may provide a red light-emitting material, a green light-emitting material, and a blue light-emitting material. The deposition sequence of the red light-emitting material, the green light-emitting material, and the blue light-emitting material may be changed, and the sequence of the first to third deposition chambers CB1 to CB3 may also be changed.

The work substrate WS disposed inside a first unloading/loading chamber ULC1 may be installed on the first mask assembly MSA1. The first mask assembly MSA1 on which the work substrate WS may be aligned may be loaded on a holding apparatus. The first light-emitting layer EML-R1 (see FIG. 7C) and the first light-emitting layer EML-R2 (see FIG. 7C) of the red light-emitting material may be formed on the work substrate WS disposed inside the first deposition chamber CB1

In a second unloading/loading chamber ULC2, the first mask assembly MSA1 may be unloaded from the holding apparatus, and the second mask assembly MSA2 may be loaded on the holding apparatus. The second light-emitting layer EML-G1 (see FIG. 7E) and the second light-emitting layer EML-G2 (see FIG. 7E) of the green light-emitting material may be formed on the work substrate WS disposed inside the second deposition chamber CB2.

In a third unloading/loading chamber ULC3, the second mask assembly MSA2 may be unloaded from the holding apparatus, and the third mask assembly MSA3 may be loaded on the holding apparatus. The third light-emitting layer EML-B1 (see FIG. 7G) and the third light-emitting layer EML-B2 (see FIG. 7G) of the blue light-emitting material may be formed on the work substrate WS disposed inside the third deposition chamber CB3.

In a fourth unloading/loading chamber ULC4, the third mask assembly MSA3 may be unloaded from the holding apparatus. In the fourth unloading/loading chamber ULC4, operations for additional processes may be further performed thereafter.

Figure 9:
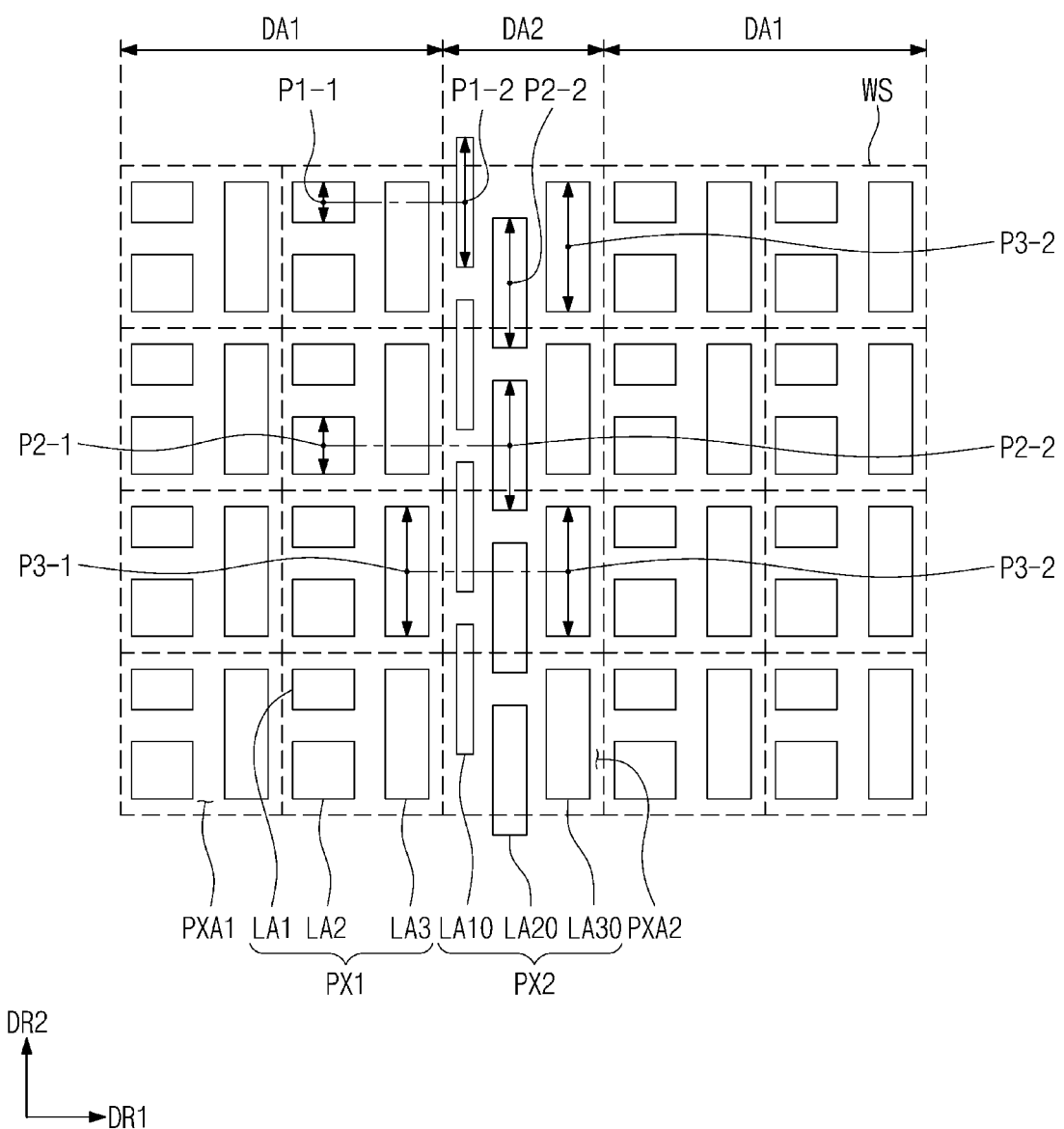
FIG. 9 is a schematic plan view of a display panel according to an embodiment of the disclosure.

FIG. 9 is a schematic plan view of a display panel DP according to an embodiment of the disclosure. Hereinafter, a duplicate description of the same configuration as the configuration described with reference to FIGS. 1 to 8 will be omitted.

Referring to a second pixel PX2 in FIG. 9, partial light-emitting regions may be shifted in the second direction DR2 with respect to the second pixel PX2 in FIG. 3. The first light-emitting region LA10 may be shifted upwards, and the second light-emitting region LA20 may be shifted downwards.

A center P1-2 in the second direction DR2 of the first light-emitting region LA10 of the second pixel PX2 may not be aligned, in the first direction DR1, with a center P2-2 in the second direction DR2 of the second light-emitting region LA20 of the second pixel PX2, and a center P3-2 in the second direction DR2 of the third light-emitting region LA30 of the second pixel PX2. For example, the center P1-2 in the second direction DR2 of the first light-emitting region LA10 of the second pixel PX2 may be disposed, in the second direction DR2, spaced apart from the center P2-2 in the second direction DR2 of the second light-emitting region LA20.

A center P1-1 in the second direction DR2 of the first light-emitting region LA1 of the first pixel PX1 may be aligned, in the first direction DR1, with the center P1-2 in the second direction DR2 of the first light-emitting region LA10. A center P2-1 in the second direction DR2 of the second light-emitting region LA2 of the first pixel PX1 may be aligned, in the first direction DR1, with the center P2-2 in the second direction DR2 of the second light-emitting region LA20 of the second pixel PX2. A center P3-1 in the second direction DR2 of the third light-emitting region LA3 of the first pixel PX1 may be aligned, in the first direction DR1, with the center P3-2 in the second direction DR2 of the third light-emitting region LA30 of the second pixel PX2.

Since centers of light-emitting regions corresponding to the first pixel PX1 and the second pixel PX2 may be aligned in the first direction DR1, defect in visibility in which light-emitting regions corresponding to the first pixel PX1 and the second pixel PX2 in the first direction DR1 are distinguished may be reduced.

Figure 10A:
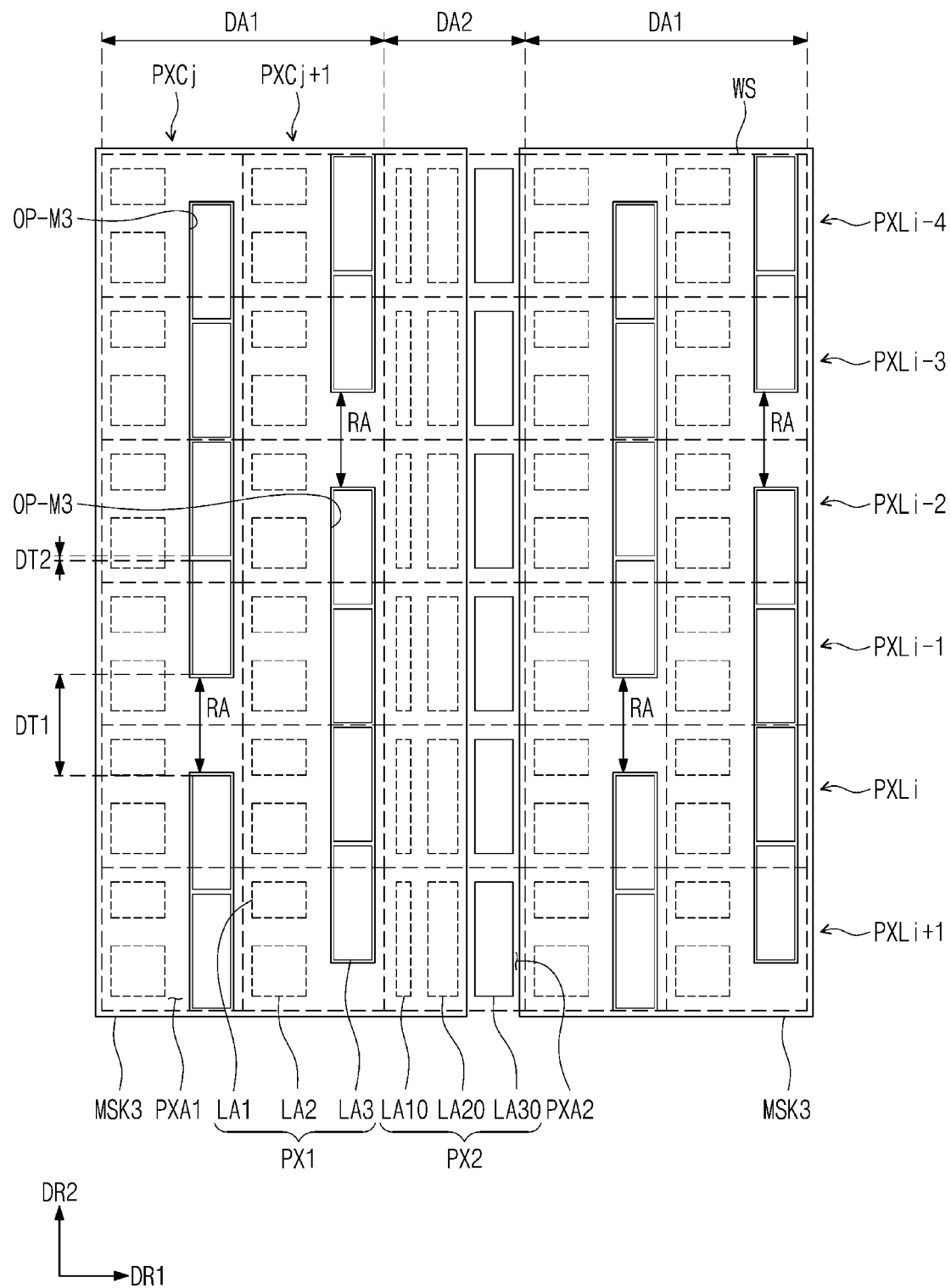
FIG. 10A is a schematic plan view illustrating a third deposition operation of a manufacturing method of a display panel according to an embodiment of the disclosure.
Figure 10B:
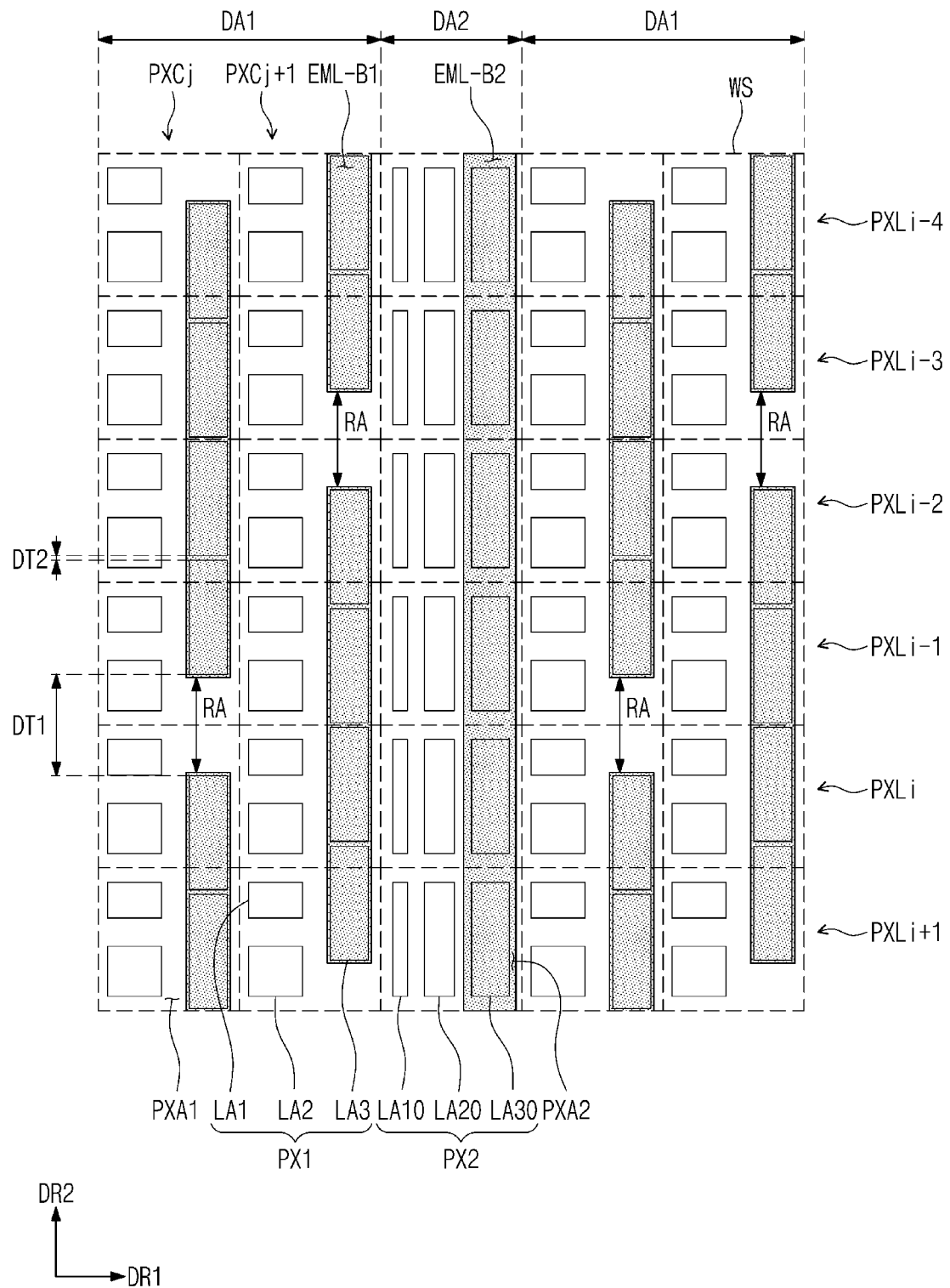
FIG. 10B is a schematic plan view of a display panel according to an embodiment of the disclosure.

FIG. 10A is a schematic plan view of a display panel DP according to an embodiment of the disclosure. FIG. 10B is a schematic plan view of a third deposition operation of a manufacturing method of a display panel DP according to an embodiment of the disclosure.

As illustrated in FIG. 10A, a third opening OP-M3 may overlap multiple third light-emitting regions LA3 successively disposed in the second direction DR2. Accordingly, as illustrated in FIG. 10B, one third light-emitting layer EML-B1 may overlap the multiple third light-emitting regions LA3 successively disposed in the second direction DR2. As a result, third openings OP-M3 may be disposed fewer than the first openings OP-M1 illustrated in FIG. 7A, and the third light-emitting layers EML-B1 may be disposed fewer than the first light-emitting layers EML-R1 illustrated in FIG. 7C. In one mask, the number of the third openings OP-M3 may be at least a half of the number of the first openings OP-M1. More detailed description will be made with reference to (i−4)-th to (i+3)-th pixel rows PXLi−4 to PXLi+1 illustrated in FIGS. 10A and 10B.

Referring to FIGS. 10A and 10B, one third opening OP-M3 may overlap four third light-emitting regions LA3 disposed on the same pixel column. The number of the third openings OP-M3 formed in one third mask MSK3 may be about a quarter of the number of the first openings OP-M1 formed in one first mask MSK1 illustrated in FIG. 7A.

One third opening OP-M3 may overlap four third light-emitting regions LA3 disposed on (i−4)-th to (i−1)-th pixel rows PXLi−4 to PXLi−1 and a j-th pixel column PXCj, and another third opening OP-M3 may overlap four third light-emitting regions LA3 disposed on i-th to (i+3)-th pixel rows PXLi to PXLi+3 and a j+1-th pixel column PXCj+1. FIG. 10A illustrates only (i−4)-th to (i+1)-th pixel rows PXLi−4 to PXLi+1. Accordingly, one third light-emitting layer EML-B1 with an integrated shape may be disposed in four third light-emitting regions LA3 disposed on (i−4)-th to (i−1)-th pixel rows PXLi−4 to PXLi−1 and a j-th pixel column PXCj.

A spaced distance between the four third light-emitting regions LA3 overlapping one third opening OP-M3 may be relatively small. A spaced distance between the third light-emitting regions LA3 disposed on the border of different third openings OP-M3 may be relatively great. It can be seen than a spaced distance DT1 between the third light-emitting region LA3 of a (i−1)-th pixel row PXLi−1 and the third light-emitting region LA3 of a i-th pixel row PXLi may be greater than a spaced distance DT2 between the third light-emitting region LA3 of a (i−2)-th pixel row PXLi−2 and the third light-emitting region LA3 of a (i−1)-th pixel row PXLi−1.

According to the above description, an area of the third light-emitting region LA3 may be increased. The length in the second direction DR2 of the region RA (hereinafter, a lip region) disposed between the third openings OP-M3 of the third mask MSK3 in the second direction DR2 may be increased. In case that the length of the region RA is great, deformation of a mask in a deposition process may be reduced, thereby suppressing a deposition defect.

Referring to FIG. 10A, one third opening OP-M3 and another third opening OP-M3, adjacent to each other in the first direction DR1, of the third openings OP-M3 may be staggered. Since the third openings OP-M3 adjacent in the first direction DR1 may not be aligned, the lip regions RA may be staggered. As the lip regions RA may be staggered, sagging or deformation of a mask may be reduced. According to an embodiment of the disclosure, the lip regions RA may be aligned in the first direction DR1.

Figure 11A:
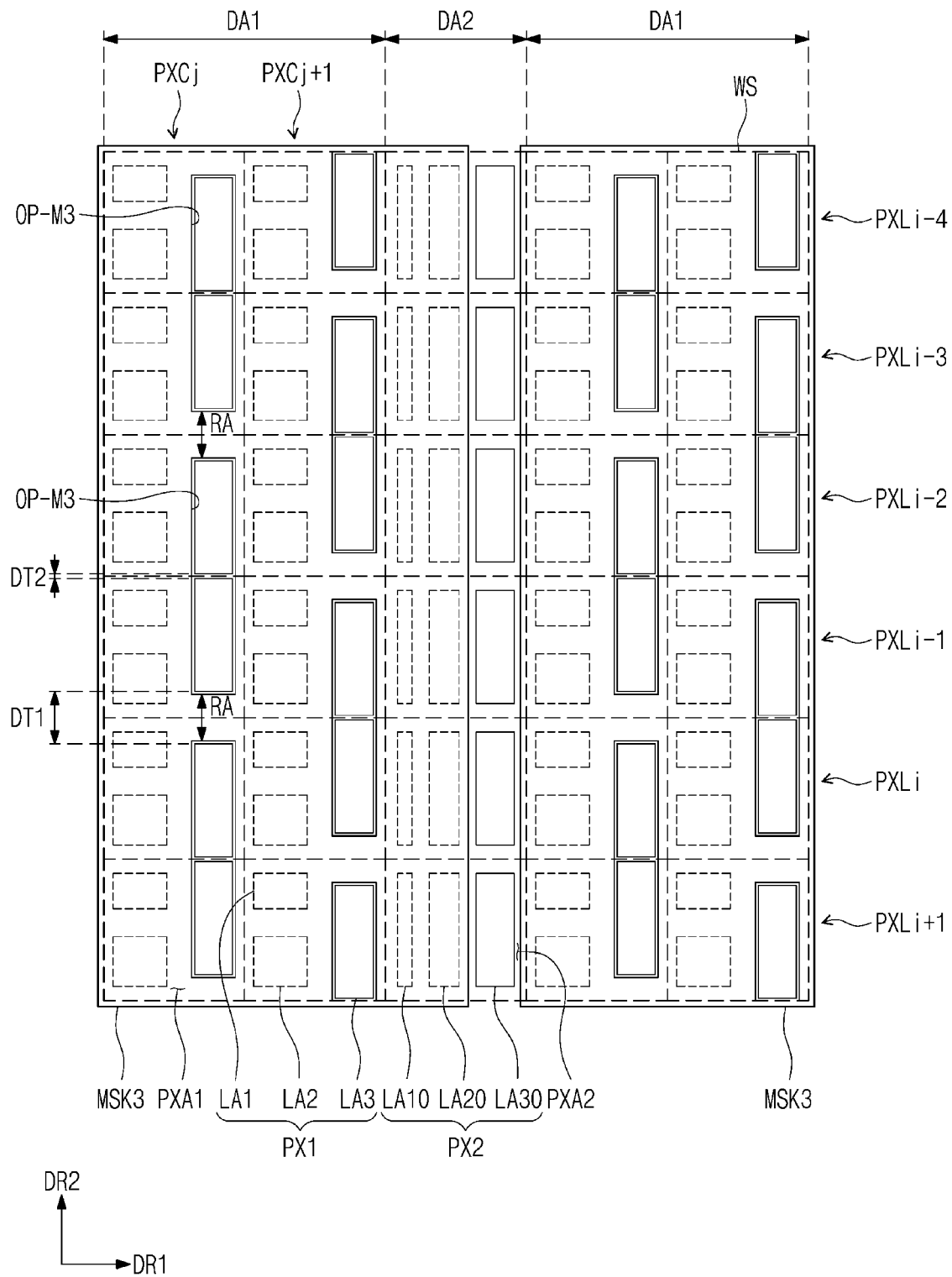
FIG. 11A is a schematic plan view illustrating a third deposition operation of a manufacturing method of a display panel according to an embodiment of the disclosure.
Figure 11B:
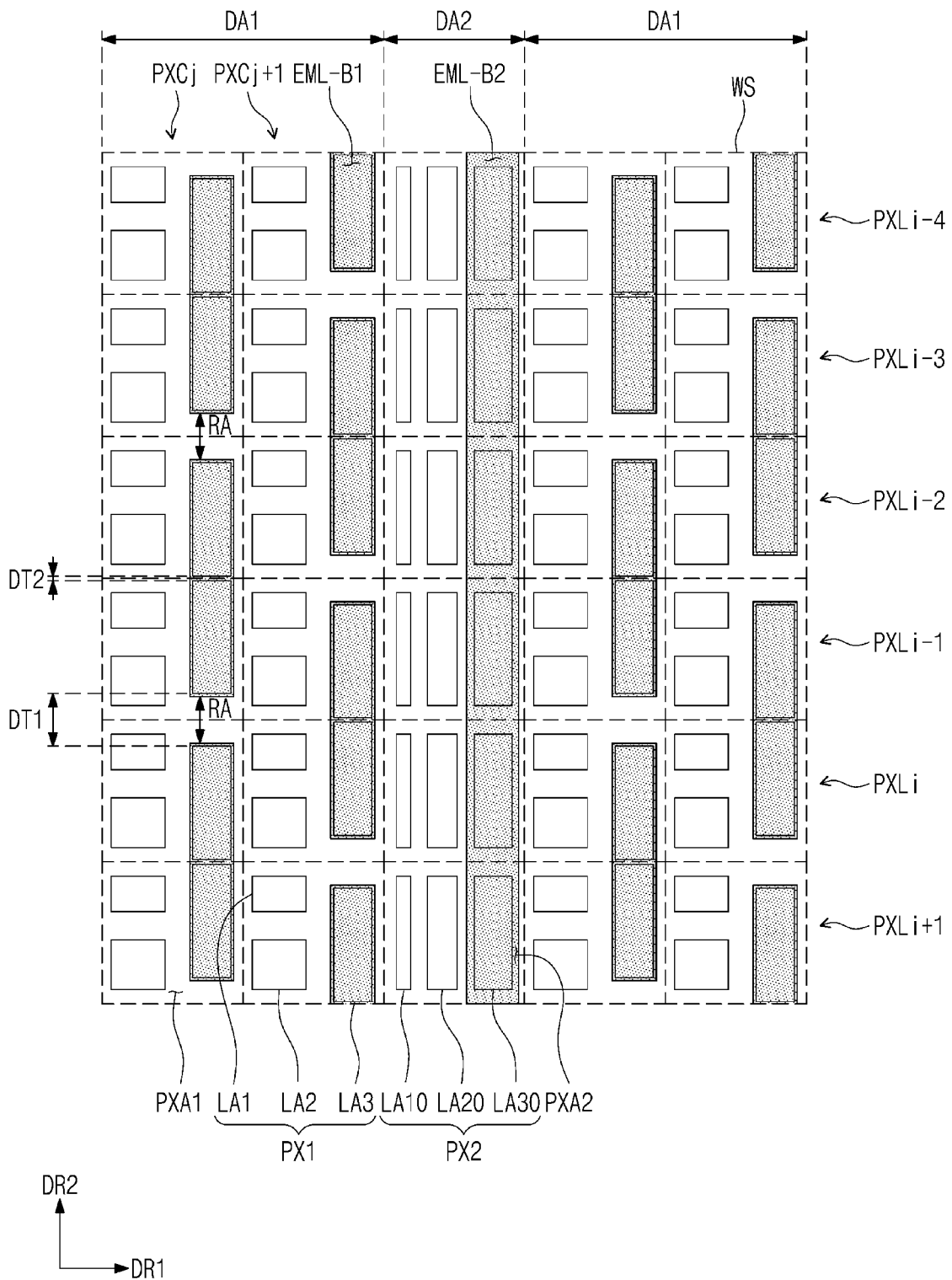
FIG. 11B is a schematic plan view of a display panel according to an embodiment of the disclosure.

FIG. 11A is a schematic plan view of a display panel DP according to an embodiment of the disclosure. FIG. 11B is a schematic plan view illustrating a third deposition operation of a manufacturing method of a display panel DP according to an embodiment of the disclosure. Hereinafter, a detailed description of the same configuration as the configuration described with reference to FIGS. 10A and 10B will be omitted.

As illustrated in FIG. 11A, a third opening OP-M3 may overlap two third light-emitting regions LA3 successively disposed in the second direction DR2. Accordingly, as illustrated in FIG. 10B, a third light-emitting layer EML-B1 may overlap two third light-emitting regions LA3 successively disposed in the second direction DR2. The number of the third openings OP-M3 formed in one third mask MSK3 may be about a half of the number of the first openings OP-M1 formed in one first mask MSK1 illustrated in FIG. 7A.

A spaced distance DT1 between two third light-emitting regions LA3 disposed on the border of different third openings OP-M3 may be greater than a spaced distance DT2 between two third light-emitting region LA3 overlapping one third openings OP-M3. A lip region RA of the third masks MSK3 may be disposed in the second direction DR2 in every two third light-emitting region LA3. Adjacent lip regions RA may be staggered in the first direction DR1.

According to the above, it may be possible to increase areas of light-emitting regions, while obtaining sufficient distances between first to third light-emitting regions Each of mask assemblies may include masks, and thus medium- or large-sized display panels may be manufactured without defects. A deposition defect in a border region may be prevented by separating adjacent masks.

In the above, description has been made with reference to embodiments of the disclosure, but those of ordinary skill in the relevant technical field may understand that various modifications and changes may be made to the disclosure while remaining within the scope of the disclosure.

Therefore, the technical scope of the disclosure is not limited to the contents expressly described in the detailed description of the specification.

What is claimed is:

1. A display panel comprising:
two first display regions spaced apart in a first direction; and
a second display region between the two first display regions, wherein
each of the two first display regions includes first pixels,
the second display region includes second pixels disposed in a second direction intersecting the first direction, each second pixel having positioned on each side in the first direction an adjacent first pixel directly facing said each second pixel,
the first pixels and the second pixels each include:
a first color light-emitting element;
a second color light-emitting element; and
a third color light-emitting element,
the first color light-emitting element, the second color light-emitting element, and the third color light-emitting element of each of the second pixels are disposed in the first direction,
an arrangement of the first color light-emitting element, the second color light-emitting element, and the third color light-emitting element of each of the first pixels is different from an arrangement of the first color light-emitting element, the second color light-emitting element, and the third color light-emitting element of each of the second pixels.

2. The display panel of claim 1, wherein a minimum distance between two adjacent light-emitting elements among the first color light-emitting element, the second color light-emitting element, and the third color light-emitting element of each of the first pixels is greater than a minimum distance between two adjacent light-emitting elements among the first color light-emitting element, the second color light-emitting element, and the third color light-emitting element of each of the second pixels.

3. The display panel of claim 1, wherein
the second color light-emitting element of each of the first pixels is spaced apart from the first color light-emitting element in the second direction, and
the third color light-emitting element of each of the first pixels is spaced apart from the first color light-emitting element in the first direction.

4. The display panel of claim 3, wherein a center in the second direction of the first color light-emitting element of each of the second pixels is spaced apart from a center in the second direction of the second color light-emitting element of each of the second pixels.

5. The display panel of claim 4, wherein a center in the second direction of the first color light-emitting element of each of the first pixels is aligned, in the first direction, with the center in the second direction of the first color light-emitting element of each of the second pixels.

6. The display panel of claim 1, wherein light-emitting regions of the first color light-emitting element, the second color light-emitting element, and the third color light-emitting element have different areas relative to each other.

7. The display panel of claim 1, wherein light-emitting regions of the first color light-emitting element of each of the first pixels and the first color light-emitting element of each of the second pixels have different shapes.

8. The display panel of claim 7, wherein the light-emitting regions of the first color light-emitting element of each of the first pixels and the first color light-emitting element of each of the second pixels have substantially a same area.

9. The display panel of claim 1, wherein the first pixels define n×m pixel rows and pixel columns, where n and m are each a natural number equal to or greater than 2, and a light-emitting layer of the third color light-emitting element of the first pixel disposed on an i-th pixel row, where i is a natural number equal to or greater than 1, and less than n, and a j-th pixel column, where j is a natural number equal to or greater than 1, and less than m, and a light-emitting layer of the third color light-emitting element of the first pixel disposed on an (i+1)-th pixel row and the j-th pixel column are integral with each other.

10. The display panel of claim 9, wherein a center in the second direction of the third color light-emitting element of the first pixel disposed on the i-th pixel row and the j-th pixel column, and a center in the second direction of the third color light-emitting element of a first pixel disposed on the i-th pixel row and the (j+1)-th pixel column are spaced apart from each other in the second direction.

11. The display panel of claim 9, wherein a light-emitting layer of the third color light-emitting element of the first pixel disposed on an (i−1)-th pixel row and the j-th pixel column, and the light-emitting layer of the third color light-emitting element of the first pixel disposed on the i-th pixel row and the j-th pixel column are spaced apart from each other in the second direction, and a distance between the third color light-emitting element of the first pixel disposed on the i-th pixel row and the j-th pixel column, and the third color light-emitting element of the first pixel disposed on the (i+1)-th pixel row and the j-th pixel column is less than a distance between the third color light-emitting element of the first pixel disposed on the (i−1)-th pixel row and the j-th pixel column, and the third color light-emitting element of the first pixel disposed on the i-th pixel row and the j-th pixel column.

12. The display panel of claim 1, wherein the first pixels define n×m pixel rows and pixel columns, where n and m are each a natural number equal to or greater than 2, and less than n, and a light-emitting layer of the third color light-emitting element of a first pixel disposed on an i-th pixel row, where i is a natural number equal to or greater than 1, and less than n, and a j-th pixel column, where j is a natural number equal to or greater than one, and less than m, to a light-emitting layer of the third color light-emitting element of a first pixel disposed on an (i+3)-th pixel row and the j-th pixel column are integral with each other.

13. The display panel of claim 1, wherein among the second pixels, a light-emitting layer of the first color light-emitting element of a second pixel, and a light-emitting layer of the first color light-emitting element of another second pixel are integral with each other.

14. The display panel of claim 1, wherein a width of each of the two first display regions in the first direction is greater than a width of the second display region.

\* \* \* \* \*